(12) United States Patent
Hong et al.

(10) Patent No.: US 9,218,875 B2
(45) Date of Patent: Dec. 22, 2015

(54) RESISTIVE NON-VOLATILE MEMORY

(71) Applicant: GLOBALFOUNDRIES Singapore Pte. Ltd., Singapore (SG)

(72) Inventors: Yang Hong, Singapore (SG); Yong Wee Francis Poh, Singapore (SG); Tze Ho Simon Chan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 336 days.

(21) Appl. No.: 13/802,841

(22) Filed: Mar. 14, 2013

(65) Prior Publication Data

US 2014/0268989 A1   Sep. 18, 2014

(51) Int. Cl.

| | |
|---|---|
| G11C 11/00 | (2006.01) |
| G11C 13/00 | (2006.01) |
| G11C 7/10 | (2006.01) |
| G11C 11/56 | (2006.01) |
| H01L 45/00 | (2006.01) |
| H01L 27/22 | (2006.01) |
| H01L 27/24 | (2006.01) |
| G11C 8/16 | (2006.01) |
| G11C 11/16 | (2006.01) |

(52) U.S. Cl.
CPC .......... *G11C 13/0002* (2013.01); *G11C 7/1075* (2013.01); *G11C 8/16* (2013.01); *G11C 11/161* (2013.01); *G11C 11/1675* (2013.01); *G11C 11/5607* (2013.01); *G11C 11/5678* (2013.01); *G11C 11/5685* (2013.01); *G11C 13/003* (2013.01); *G11C 13/0007* (2013.01); *H01L 27/224* (2013.01); *H01L 27/2409* (2013.01); *H01L 27/249* (2013.01); *H01L 45/04* (2013.01); *H01L 45/06* (2013.01); *H01L 45/08* (2013.01); *H01L 45/126* (2013.01); *H01L 45/1226* (2013.01); *H01L 45/144* (2013.01); *H01L 45/146* (2013.01); *G11C 2211/5641* (2013.01); *G11C 2213/78* (2013.01); *G11C 2213/79* (2013.01)

(58) Field of Classification Search
CPC .... G11C 11/16; G11C 2213/79; G11C 13/03; G11C 8/16; G11C 13/002; G11C 13/004; G11C 8/08
USPC ............ 365/148, 158, 163, 171, 173, 185.05, 365/63, 210.1, 210.15
See application file for complete search history.

(56) References Cited

U.S. PATENT DOCUMENTS

| | | | |
|---|---|---|---|
| 6,697,294 B1 * | 2/2004 | Qi et al. ................... | 365/210.15 |
| 7,835,210 B2 * | 11/2010 | Shimizu ................... | 365/210.15 |
| 2009/0067212 A1 * | 3/2009 | Shimizu ....................... | 365/148 |
| 2009/0267212 A1 | 10/2009 | Wada et al. | |
| 2010/0283028 A1 * | 11/2010 | Brubaker et al. ................. | 257/2 |
| 2012/0079330 A1 * | 3/2012 | Kawaguchi et al. .......... | 714/718 |
| 2014/0268990 A1 * | 9/2014 | Hong et al. ................... | 365/148 |

* cited by examiner

*Primary Examiner* — Gene Auduong
(74) *Attorney, Agent, or Firm* — Horizon IP PTE LTD

(57) ABSTRACT

A multi-bit NVM cell includes a storage unit having resistive elements, such as phase change resistive elements. The NVM cell may be configured as a single port or dual port multi-bit cell. The NVM cell includes primary and secondary cell selectors. The primary selector selects the multi-bit cell while the secondary selector selects a bit within the multi-bit cell. A plurality of storage units can be commonly coupled to a primary selector, facilitating high density applications.

22 Claims, 32 Drawing Sheets

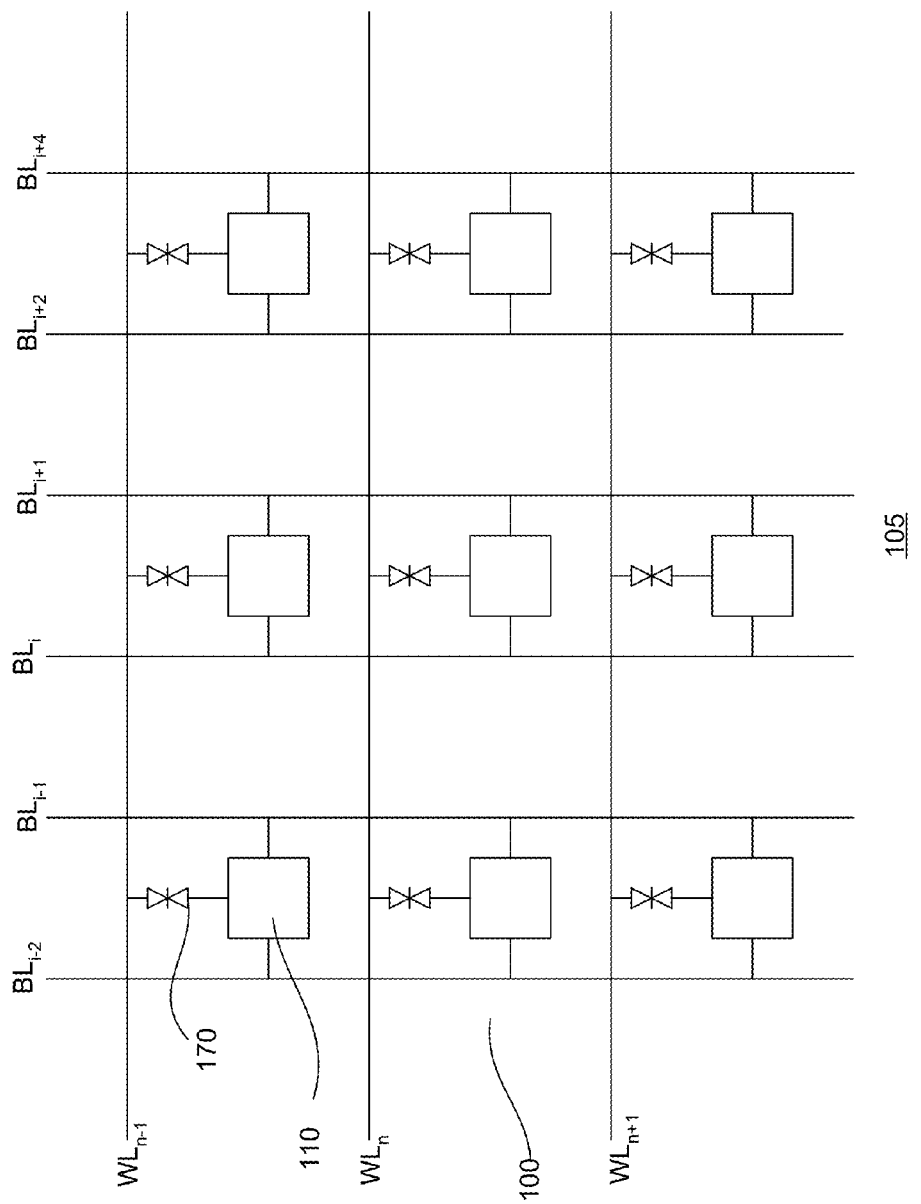

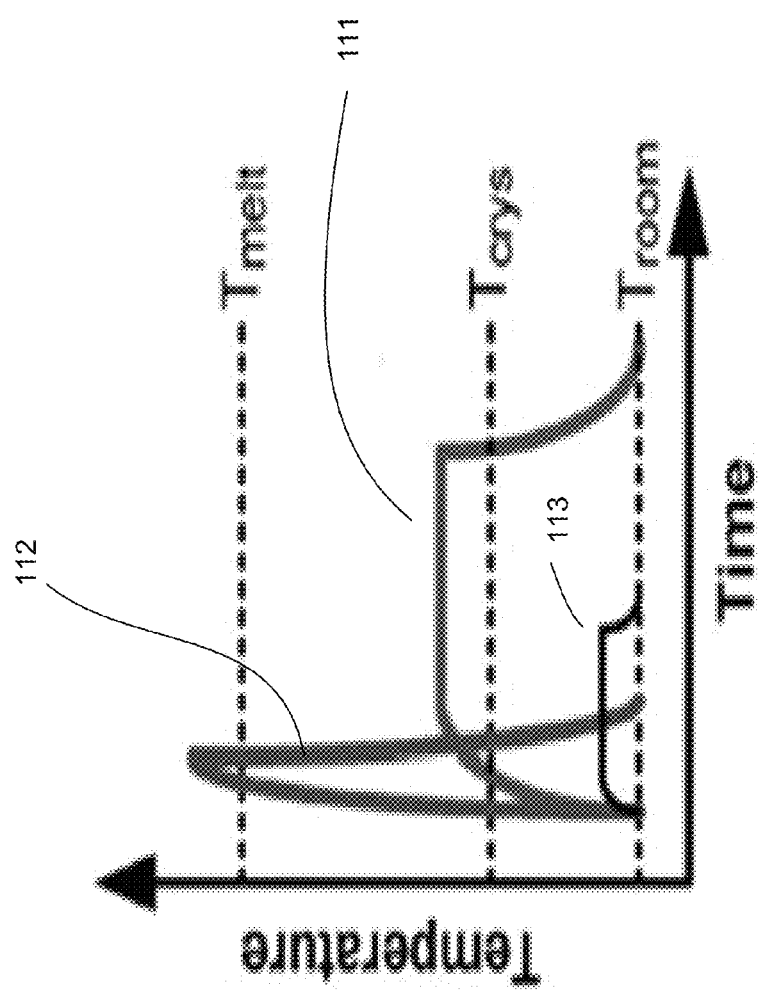

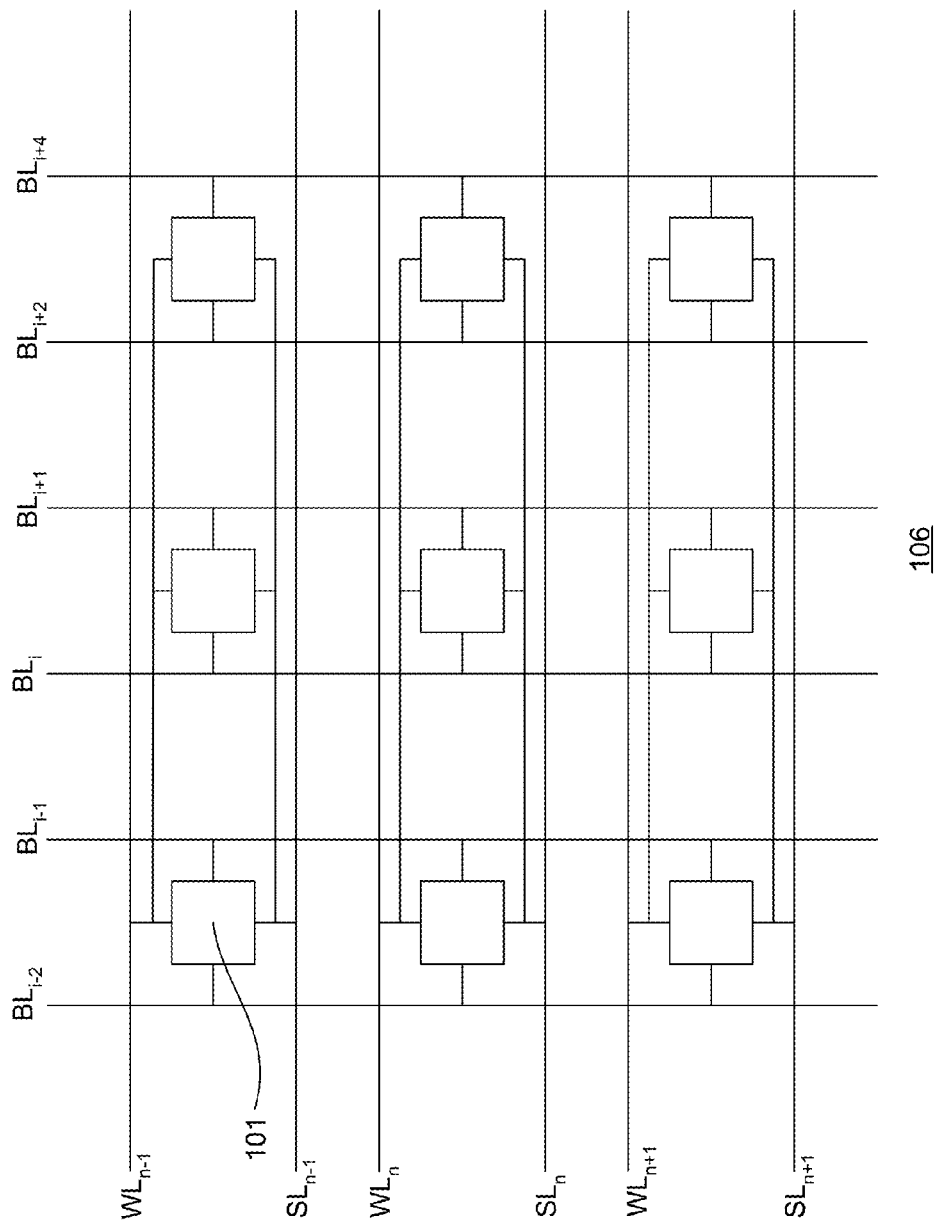

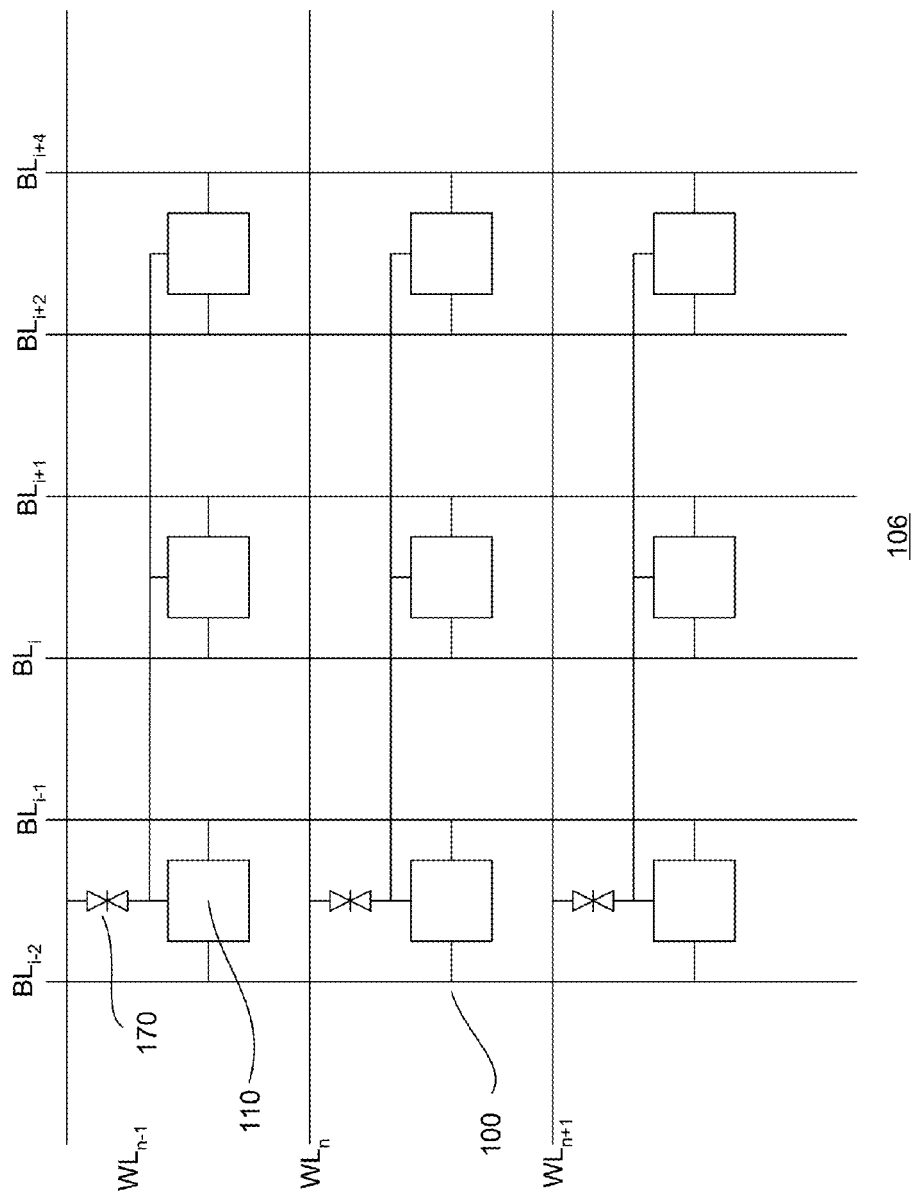

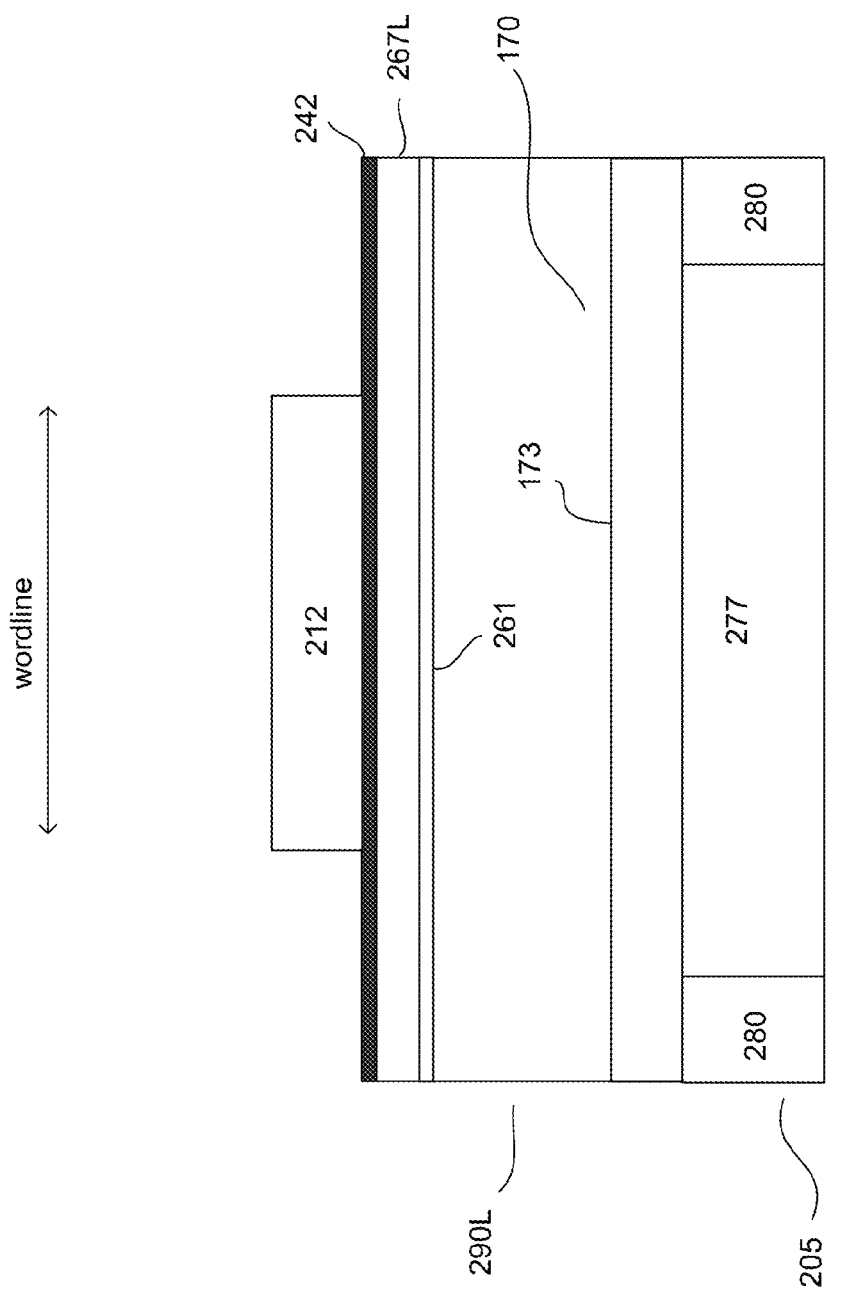

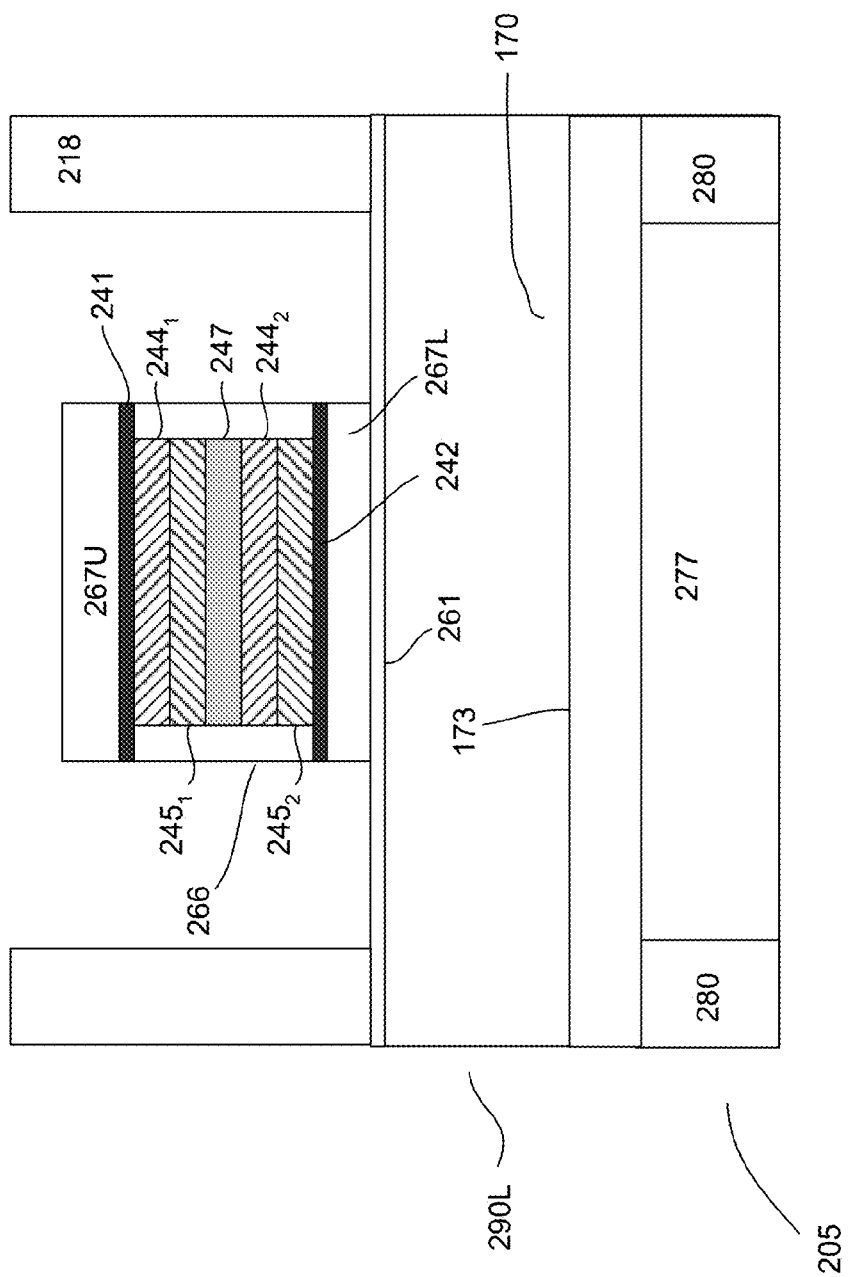

RESISTIVE NON-VOLATILE MEMORY

CROSS-REFERENCE TO RELATED APPLICATION

This application cross-references to US patent application, titled "STACKABLE NON-VOLATILE MEMORY" (application Ser. No. 13/802,899) that is concurrently filed and assigned to the same assignee as this application, which is herein incorporated by reference for all purposes.

BACKGROUND

Resistive-type non-volatile memories (NVMs), such as phase change random access memories (PCRAMs), employ memory elements having different stable resistive states. Such resistive elements enable data corresponding to the different resistive states to be stored. The memory element switches between one resistive state to another. For PCRAMs, the switching between the states involves switching between an amorphous to a crystalline phase. The switch between the two phases is achieved by heating the memory element using a heater.

However, conventional resistive NVMs have drawbacks. For example, conventional resistive NVMs, such as PCRAMS, require large programming currents to switch from one resistive state to the other. To produce the necessary programming currents, a large transistor is needed. This results in a large cell size. Furthermore, the memory elements are disposed in close proximity to various heat sinks, such as metal lines as well as top and bottom electrodes, contributing to undesired heat loss and low heating efficiency. Inefficient heating and heat loss, as well as the proximity effect on the neighboring cells result in a decrease in reliability performance and an increase in power consumption due to large programming current requirements.

Therefore, there is a need to improve resistive NVMs.

SUMMARY

A memory cell is disclosed. In one embodiment, the memory cell includes a storage unit having a plurality of resistive elements. The memory cell also includes a primary selector coupled to the storage unit. The primary selector, when active, selects the memory cell for access. The memory cell further includes a secondary selector having first and second secondary selectors. The secondary selectors coupled to the storage unit and the primary selector. When appropriate signals are applied to the memory cell, the secondary selector selects an appropriate resistive element of the storage unit.

In one embodiment, a method of forming a memory cell is disclosed. The method includes providing a substrate. The method also includes forming a cell stack. The cell stack includes a bit selector stack disposed between top and bottom cell stack layers. The bit selector stack includes first and second secondary selectors, and a selector connection layer separating the first and second secondary selectors. The method further includes forming first and second bitline (BL) connection units at opposing first sides of the cell stack. The BL connection units are coupled to the top and bottom cell stack layers without contacting the bit selector stack, wherein resistive elements are disposed at interfaces of the top and bottom cell stack layers and the first and second BL connection units.

In yet another embodiment, a method of forming a memory cell is disclosed. The method includes providing a substrate with a lower metal level. The method also includes forming a cell stack above the lower metal level. The cell stack includes a bit selector stack disposed between top and bottom cell stack layers. The top and bottom cell stack layers comprise a phase change material. The bit selector stack includes first and second secondary selectors, and a selector connection layer separating the first and secondary selector. The method also includes forming first and second bitline (BL) connection units at opposing first sides of the cell stack. The BL connection units are coupled to the top and bottom cell stack layers by cell stack connectors disposed between the ends of the cell stack layers and BL connection units. The cell stack connectors serve as heaters for the top and bottom cell stack layers.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following

FIG. 1d shows a portion of another exemplary memory cell array;

FIG. 1e shows an embodiment of temperature-time plot;

FIG. 1h shows an exemplary portion of a memory array;

FIG. 1i shows another exemplary portion of a memory array;

FIGS. 3a-m show cross-sectional views of a process of forming an embodiment of a device.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1A:
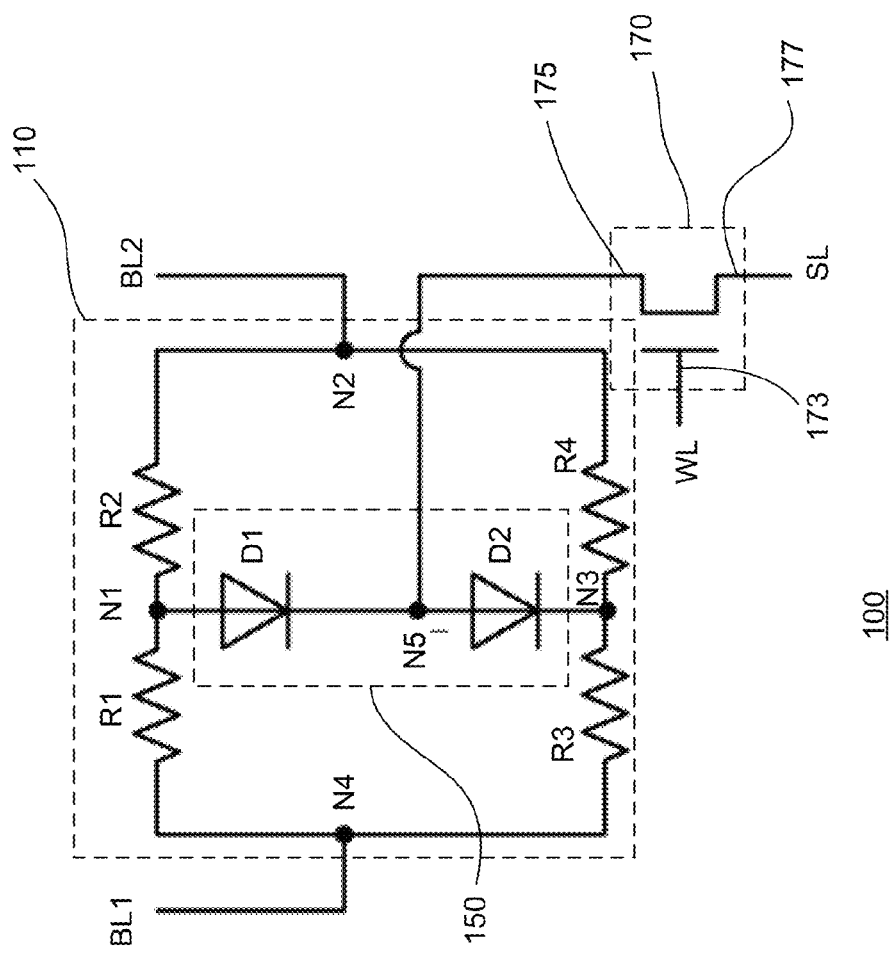
FIG. 1a shows a circuit diagram in accordance with an embodiment of a device.

FIG. 1a shows a schematic diagram of an embodiment of a device. In one embodiment, the device includes a memory cell 100. The memory cell, in one embodiment, is a resistive-type memory cell. In one embodiment, the memory cell is a multi-bit memory cell.

As shown, the memory cell includes a plurality of resistive elements connected to form a storage unit. In one embodiment, the memory cell includes first, second, third and fourth resistive elements R1, R2, R3 and R4. Providing other number of resistive elements may also be useful. The resistive elements are employed for storing information, corresponding to bits of a multi-bit memory cell.

A resistive element is a programmable resistive element. The programmable resistive element has multiple stable resistive states. In one embodiment, the resistive element is a bi-stable resistive element having first and second stable resistive states. For example, the resistive element has a stable high resistive state and a stable low resistive state, with one corresponding to a logic "0" and the other corresponding to a logic "1". For example, the high resistive state may represent a logic 0 while the low resistive state may represent a logic 1. Having the high resistive state representing a logic 1 and the low resistive state representing a logic 0 may also be useful. Other configurations of data storage for the resistive element may also be useful. For example, the resistive element may have more than two stable states. For example, the resistive element may have $2^n$ resistive states, where n is a whole number greater than 1. For example, the resistive element may have 4 resistive states (n=2), representing 00, 01, 10 and 11. Other number of resistive states may also be useful.

In one embodiment, the resistive elements include a phase change (PC) material to form a PCRAM cell. Other types of resistive elements forming other types of RAMs may also be useful. The PC material (PCM) has stable first and second phases. For example, the PCM can be in first or second phases, corresponding to resistive states. For example, the first phase is a high resistive state and the second phase is a low resistive state. In one embodiment, the high resistive state is an amorphous phase and the low resistive state is a crystalline phase. One resistive state represents a logic "0" while the other resistive state represents a logic "1". For example, the high resistive state may represent a logic "0" while the low resistive state may represent a logic "1". Other configurations of PCMs may also be useful.

The PCM, in either phase or state, is stable until reset or set. The PCM, for example, is stable at below a threshold temperature. For example, the threshold temperature is about 85° C. Other threshold temperatures may also be useful and may depend on the type of PCM employed. The threshold temperature, for example, should be above normal operating temperature of the device. The retention of the PCM should be, for example, 10 years. The PCM may be reset to the amorphous phase from the crystalline phase by exposing it to a reset condition or set from the amorphous phase to the crystalline phase by exposing it to a set condition.

In one embodiment, the set condition includes heating the PCM at its amorphous phase to a crystallization temperature for a sufficient time to transform it to a crystalline phase. On the other hand, the reset condition includes heating to melt the crystalline PCM and rapidly cooling it so it becomes amorphous. Heating the PCM includes appropriately passing current to a heater or a heating element.

The PCM, in one embodiment, is a chalcogenide material. In one embodiment, the chalcogenide material is a GeSbTe alloy. In one embodiment, the chalcogenide material is $Ge_2Sb_2Te_5$ (GST). Other types of chalcogenide or PCMs may also be employed. In alternative embodiments, other types of resistive materials may be used to form other types of resistive elements.

The resistive elements are interconnected to form a resistive circuit or storage unit 110 of the memory cell. For example, the resistive elements are interconnected to form a resistive loop. A resistive element includes first and second resistive element terminals (RETs). In one embodiment, first RETs of two adjacent resistive elements are commonly coupled and second RETs of two adjacent resistive elements are commonly coupled. Coupling of two resistive elements forms a node of the resistive loop. For example, the first RETs of R1 and R2 form node N1, the second RETs of R2 and R4 form node N2, the first RETs of R4 and R3 form node N3 and the second RETs of R3 and R1 form node N4.

The storage unit includes a bit selector 150. The bit selector may be referred to as a secondary selector. The secondary selector facilitates selecting a bit of the multi-bit memory cell to access. In one embodiment, the secondary selector includes first and second secondary selectors. In one embodiment, the first and second secondary selectors include first and second diodes D1 and D2 coupled in series. Other types of selectors may also be useful. A diode includes a first and second opposing polarity terminals. The first terminal, for example, is an anode (+) terminal and the second terminal is a cathode (−) terminal. In one embodiment, the diodes are coupled in series with the opposing polarity terminals being coupled. For example, an anode terminal of one diode is coupled to a cathode terminal of the other diode. As shown, a cathode terminal of the D1 is coupled to an anode terminal of D2. An anode terminal of D1 is coupled to N1 and a cathode terminal of D2 is coupled to N3. Alternatively, the diodes of the bit selector may be reversed. The common terminals of D1 and D2 forms node N5.

A cell selector 170 is coupled to the resistive elements. The cell selector, for example, may be referred to as a primary selector used to select the storage unit. The primary selector is a transistor. In one embodiment, the cell selector is a metal oxide semiconductor (MOS) transistor. The transistor includes gate and first and second transistor terminals 173, 175 and 177. The first transistor terminal is coupled to the bit selector. As shown, the first transistor terminal is coupled to N5. The second transistor terminal is coupled to a select line SL and the gate terminal is coupled to a wordline WL. First and second bitlines BL1 and BL2 are coupled to the resistive elements. In one embodiment, BL1 is coupled to N4 and BL2 is coupled to N2.

Figure 1B:
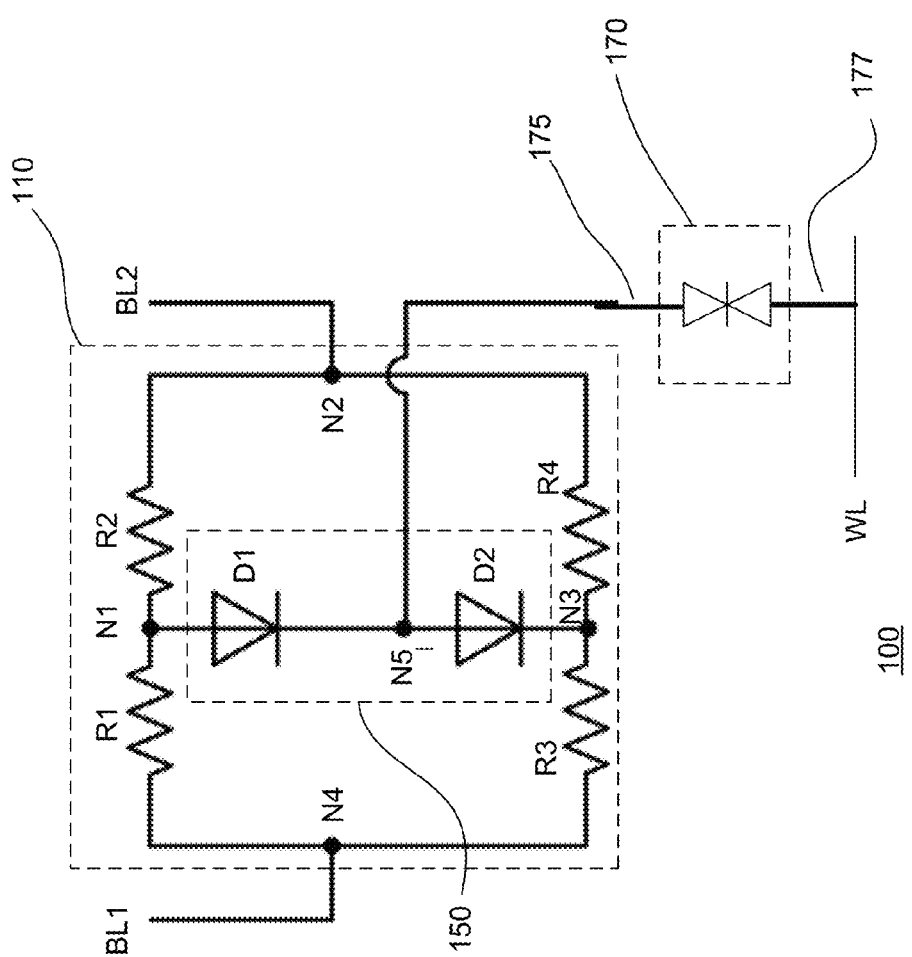
FIG. 1b shows a circuit diagram in accordance with another embodiment of a device.

Alternatively, the transistor of the cell selector may be a bipolar junction transistor (BJT). For example, a first terminal of the BJT may be coupled to N5 while a second terminal may be coupled to SL while the base of the BJT is coupled to a WL. The first and second terminals, for example, are the collector and emitter terminals of the BJT. For example, in the case of a NPN BJT, the collector is coupled to the N3 and the emitter is coupled to the SL. Other types of cell selectors may be employed. For example, in some cases, a diode may be used as a cell selector, as shown in FIG. 1b. In such cases, the diode is provided between N5 and WL, forming a cross-point type of memory cell. For example, a first terminal 175 of the diode is coupled to N5 while a second terminal of the diode is coupled to WL. No SLs are employed for primary selectors which are diodes.

Figure 1C:
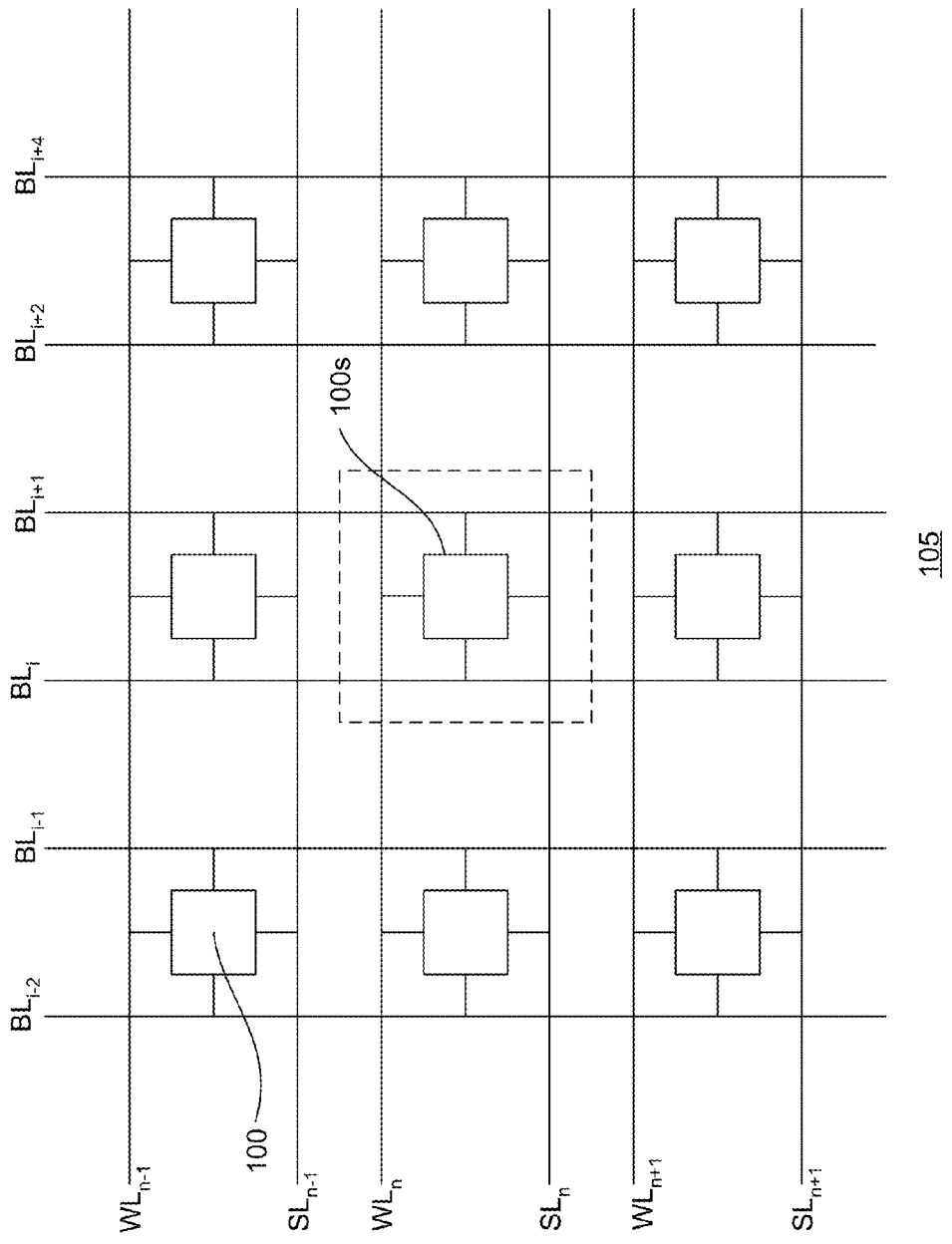
FIG. 1c shows a portion of an exemplary memory cell array.

FIG. 1c shows a portion of a memory cell array 105. The portion, as shown, is a 3×3 array of memory cells 100, as described in FIG. 1. The memory cells are interconnected by WLs, BLs and SLs. The array, for example, includes WLs and SLs in the row direction and BLs in the column direction. A memory cell 100s may be selected by applying the appropriate signals to $WL_n$, $BL_i$ and $BL_{i+1}$. For BLs of unselected cells, they are floated or in a high impedance state (Z state). As for the SLs, they may be coupled to the substrate well or ground, effectively forming a common SL. Other configurations of SLs may also be useful. FIG. 1d shows a portion of an array for the case where the primary selector is a diode. As shown, the primary diode selector 170 is coupled to the storage unit of a memory cell.

The memory cell may be configured as a dual port dual-bit or a single port quad bit memory cell. In the case of a dual port configuration, BL1 and BL2 serve as first and second ports while R1 and R2 form one bit and R3 and R4 form another bit of the memory cell. For example, R1 and R2 form the first bit and R3 and R4 form the second bit of the dual-bit memory cell. The two resistive elements of a bit are in opposite states. For example, one is in the high resistance state (amorphous or RESET state) while the other is in the low resistance state (poly-crystalline or SET state). One port may be referred to as the true port while the other port may be referred to as the complementary port. For example, the first port is the true port and reflects the data stored in R1 and the second port reflects the complementary data stored in R2.

An active signal at the WL selects a row of cells associated with the activated WL. To select a cell within the row of the activated WL, appropriate voltages are provided at BL1 and BL2 associated with the selected cell. As shown, an appropriate positive voltage selects the first bit (R1 and R2) while an appropriate negative voltage selects the second bit (R3 and R4). The reverse would be true if the diodes D1 and D2 of secondary selector were arranged in the opposite direction. The appropriate voltage, in one embodiment, has a magnitude which is larger than the sum of the threshold of the primary selector, the threshold of the respective secondary selector (e.g., D1 or D2) and the threshold of the PCM. For bit 1, the polarity is positive while for bit 2, the polarity is negative. Other configurations of voltages applied to the BLs for selecting the desired bit of the cell may also be useful.

As described, the dual port memory cell employs the BLs polarity to select the appropriate bit or resistors to access. These complementary states of R1 and R2 or R3 and R4 result in faster reading operation as well a larger sensing margin without the need of a reference cell. Thereby, increased bit/per area density and performance are achieved. Additionally, larger sensing margin leads to simpler or less complex peripheral circuits, resulting in smaller area needed.

Table 1a below shows signals at BLs, WL and SL for a program access for bit 1 or bit 2 of the memory cell:

TABLE 1a

| Program Access | BL1 | BL2 | WL | SL |
|---|---|---|---|---|
| Bit 1 = 0 | Positive RESET Pulse (R1: high R) | Positve SET Pulse (R2: Low R) | $V_{WLA}$ | GND |
| Bit 1 = 1 | Positive SET Pulse (R1: low R) | Positive RESET Pulse (R2: high R) | $V_{WLA}$ | GND |
| Bit 2 = 0 | Negative RESET Pulse (R3: high R) | Negative SET pulse (R4: low R) | $V_{WLA}$ | GND |
| Bit 2 = 1 | Negative SET pulse (R3: low R) | Negative RESET Pulse (R4: high R) | $V_{WLA}$ | GND |

Table 1a, as shown, reflects signals for logic 1 as being low impedance and logic 0 as being high impedance. In the case that logic 1 corresponds to high impedance and logic 0 corresponds to low impedance, the SET and RESET signals may be switched. Additionally, the polarity of the signals may be switched for a secondary selector having diode directions reversed to that shown in FIG. 1a. To perform a read access, the signals applied to the bitlines (read pulses) may be the same polarity, but lower than the threshold voltage of the PCM. For example, the magnitude of the read voltage applied to the BLs is less than the melt and crystallization temperature of the PCM. As for $V_{WLA}$ signal, it is equal to the active signal at the WL to select a row of cells. For non-selected rows, an inactive WL signal $V_{WLI}$ is provided. For example $V_{WLA}$ may be a logic 1 signal and a $V_{WLI}$ is a logic 0 signal. Other configurations of $V_{WLA}$ and $V_{WLI}$ may also be useful. For example, in the case of FIG. 1b, $V_{WLA}$ is applied to $WL_n$, and SET and RESET signals are applied to $BL_i$ and $BL_{i+1}$.

As discussed, the memory cell may also be configured as a single port quad bit memory cell. The bit of the selected cell is selected based on the voltage applied to the BL1 and BL2. In the case of a single port quad bit memory cell, BL1 accesses R1 and R3 while BL2 accesses R2 and R4. Table 1b below shows a signals applied to the WL, SL and BLs for a program access:

TABLE 1b

| Program Access | BL1 | BL2 | WL | SL |
|---|---|---|---|---|
| Bit 1 = 0 | Positive RESET Pulse (R1: high R) | Floating or High Z | $V_{WLA}$ | GND |
| Bit 1 = 1 | Positive SET Pulse (R1: low R) | Floating or High Z | $V_{WLA}$ | GND |
| Bit 2 = 0 | Floating or High Z | Negative RESET Pulse (R2: high R) | $V_{WLA}$ | GND |
| Bit 2 = 1 | Floating or High Z | Negative SET pulse (R2: low R) | $V_{WLA}$ | GND |
| Bit 3 = 0 | Positive RESET Pulse (R3: high R) | Floating or High Z | $V_{WLA}$ | GND |
| Bit 3 = 1 | Positive SET Pulse (R3: low R) | Floating or High Z | $V_{WLA}$ | GND |
| Bit 4 = 0 | Floating or High Z | Negative RESET Pulse (R4: high R) | $V_{WLA}$ | GND |
| Bit 4 = 1 | Floating or High Z | Negative SET Pulse (R4: low R) | $V_{WLA}$ | GND |

Table 1b, as shown, reflects signals for logic 1 as being low impedance and logic 0 as being high impedance. In the case that logic 1 corresponds to high impedance and logic 0 corresponds to low impedance, the SET and RESET signals may be switched. Additionally, the polarity of the signals may be switched for a secondary selector having diode directions reversed to that shown in FIG. 1a. To perform a read access, the signals applied to the bitlines (read pulses) may be the same polarity, but lower than the threshold voltage of the PCM. For example, the magnitude of the read voltage applied to the BLs is less than the melt and crystallization temperature of the PCM. As for $V_{WLA}$ signal, it is equal to the active signal at the WL to select a row of cells. For non-selected rows, an inactive WL signal $V_{WLI}$ is provided. For example $V_{WLA}$ may be a logic 1 signal and a $V_{WLI}$ is a logic 0 signal. Other configurations of $V_{WLA}$ and $V_{WLI}$ may also be useful. For example, in the case of FIG. 1b, $V_{WLA}$ is applied to $WL_n$, and SET and RESET signals are applied to $BL_i$ and $BL_{i+1}$.

FIG. 1e shows an embodiment of temperature-time plot 108 for the SET, RESET and READ pulses. Referring to FIG. 1e, curve 111 is the SET pulse. As shown, the SET pulse has a slow rise time to above the crystallization temperature of the PCM. The SET pulse, once it reaches the peak temperature, has a linear portion and a slow fall time to room temperature. This is to ensure that the PCM sufficiently crystallizes after being above the crystallization temperature. As for the RESET pulse 112, it has a fast rise time to above the melting temperature of the PCM and a fast fall time to room temperature. This is to ensure that the PCM melts and does not have a chance to crystallize. As for the read pulse 113, it has a peak voltage below the crystallization temperature. The read pulse remains at the peak read voltage sufficiently long to perform the read access. This ensures that the phase of the PCM is not changed.

Table 1c shows various voltage values for the different signals of BLs and WL. The voltages are exemplary values and may differ, depending on the technology.

TABLE 1c

| Signals | Value (V) |
| --- | --- |
| $V_{WLA}$ | About 1.8 |
| $V_{WLI}$ | 0 |
| $V_{SL}$ | 0 |
| $V_{BL}$ (unselected) | Floating or high-Z state |
| $V_{BL}$ RESET Pulse | About 50 ns duration with peak V of about 1.8~2.5 V |
| $V_{BL}$ SET Pulse | About 100~300 ns duration with peak V of about 1.8~2.8 V |
| $V_{BL}$ Read Pulse | About 50~150 ns duration at about 1.2~1.5 V |

The values of the signal provided in Table 1c are exemplary. These values may change, depending on, for example, the technology. The various signals should be sufficient to achieve the objective, such as performing the memory access (e.g., programming and reading) on the desired bit of the memory cell. Furthermore, it is understood that the stimuli for setting and resetting is the current which is produced by the voltage pulses. The voltage pulses are provided to produce the desired SET and RESET currents. For example, in the case of a SET current, it may be about 120 μA while the RESET current is about 200 μA for 40 nm node. Other SET and RESET current values may also be useful. For example, the values may depend on the PCM. As for the Read pulse, it may have a shorter duration, such as about 12~25 ns for a resistive element set at about 500~1000 ohms (e.g., crystalline state). Other Read pulse durations may also be useful. For example, the values may depend on the PCM.

Figure 1F:
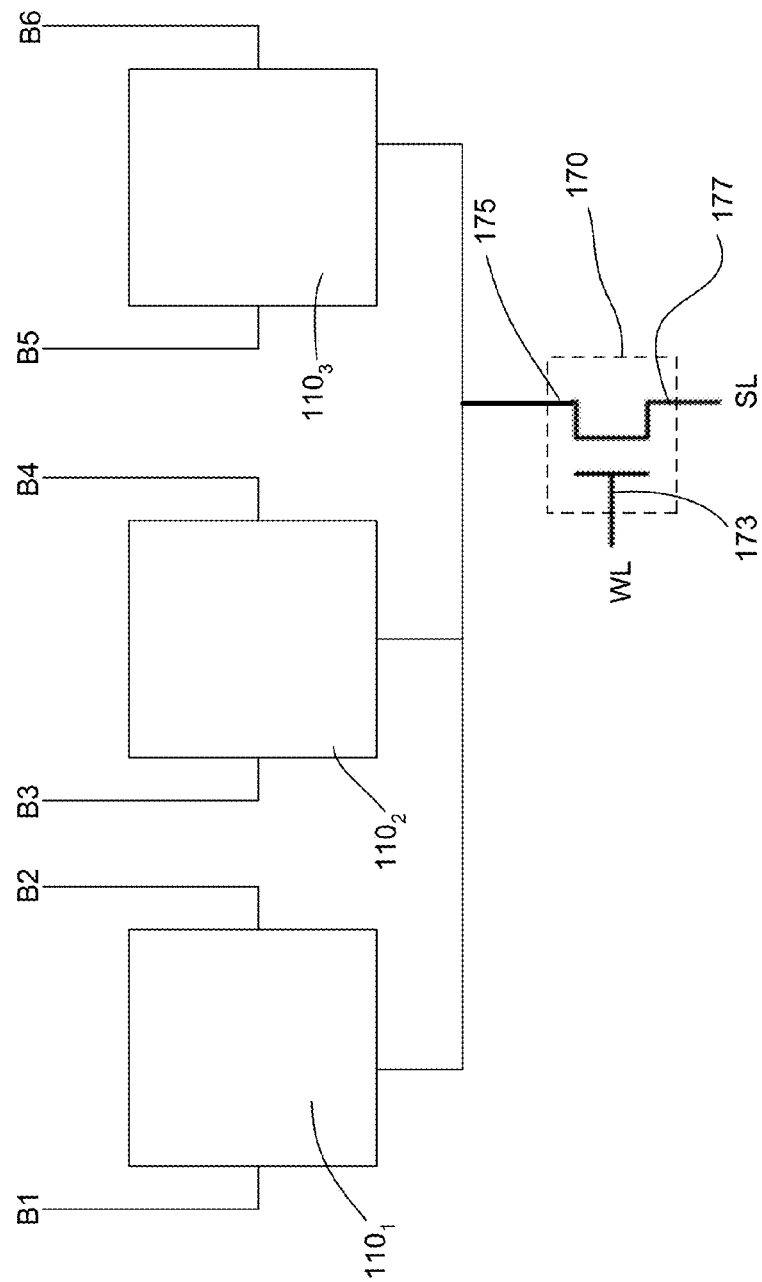
FIGS. 1f-g show exemplary embodiments of a memory cell.

FIG. 1f shows an alternative embodiment of a memory cell 101. The memory cell is similar to that described in FIG. 1a. Common elements may not be described or described in detail. As shown, the memory cell includes a primary selector 170 coupled to a plurality of storage units 110. As an example, the primary selector is coupled to first, second and third storage units $110_{1-3}$. Providing other numbers of storage units may also be useful. The number of storage units, for example, may depend on the number of metal level in the IC.

Figure 1G:
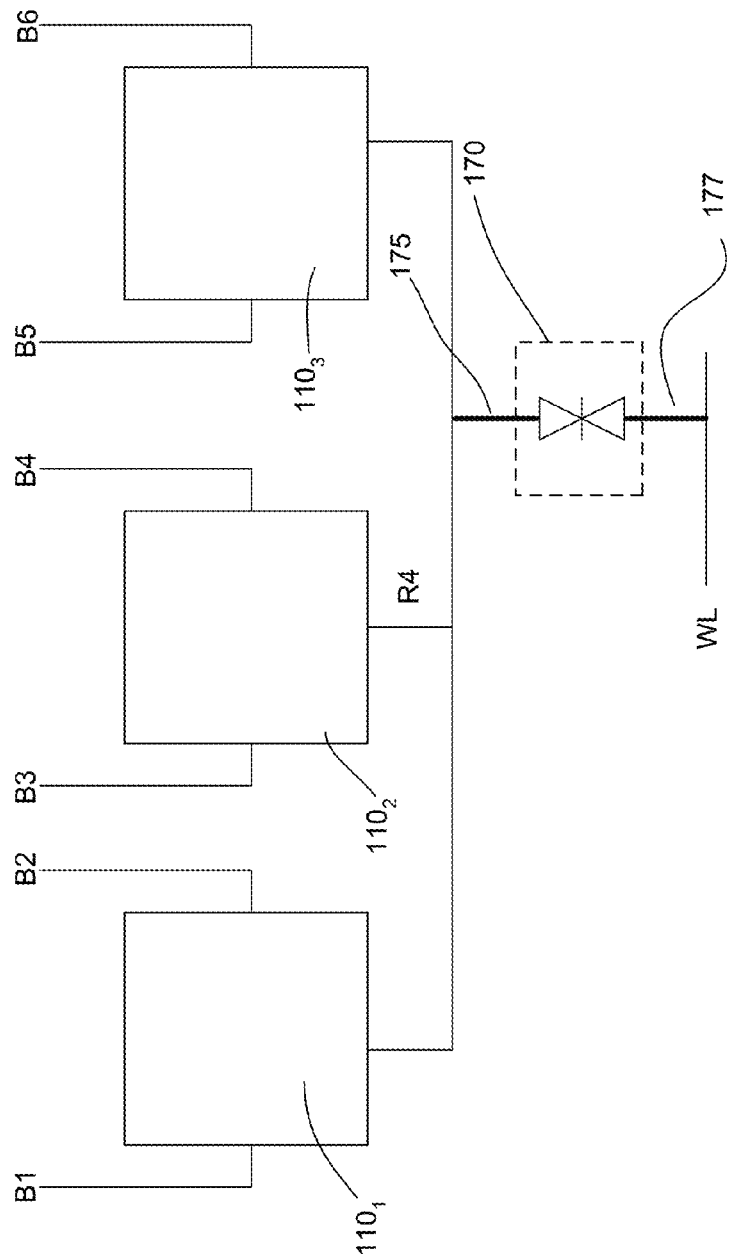

The primary selector, for example, may be a MOS transistor. Other types of cell selectors may also be useful. As shown, a first terminal 175 of the primary selector is coupled to N5 of the plurality of storage units. When a WL coupled to a control terminal of the primary selector, the various storage units coupled to it are selected. FIG. 1g shows an alternative embodiment of the memory cell 101. As shown, the primary selector 170 is a diode coupled to a plurality of storage units. For example, the primary selector is coupled to first, second and third storage units $110_{1-3}$.

FIG. 1h shows a portion of a memory array 106. The portion, as shown, is a 1×3 array of memory cells 101, as described in FIG. 1f. The memory cells are interconnected by WLs, BLs and SLs. The array, for example, includes WLs and SLs in the row direction and BLs in the column direction. Alternatively, the WLs and SLs may be in the column direction and BLs in the row direction. Other configurations of WLs, SLs and BLs may also be useful. A row in the portion, as shown includes one memory cell with 3 storage units. For example, a storage unit is coupled to first and second BLs. The storage units of a memory cell are selected by activating primary selector of the memory cell. Selecting a bit of the selected storage units is achieved by applying the appropriate voltages to the BLs of the memory cell. FIG. 1i shows another embodiment of a memory array 106. The array includes memory cells, as described in FIG. 1g.

As described, the resistive elements include a PCM. In other embodiments, the resistive element may be formed of a resistive material to form resistive RAMs (ReRAMs) or a magnetic resistive material to form a spin torque transfer RAM (STT-RAMs). Other types of resistive materials or RAMs having changeable resistive states may also be useful for the resistive elements. For example, any 2-terminal resistor-based RAM which uses a resistor's changeable resistance to represent logic states, such as "0" or "1" may be useful.

In the case of the resistive material (RM), it is a dielectric material which has first and second resistive states. For example, the first state is a high resistive state and the second state is a low resistive state. One resistive state represents a logic "0" while the other resistive state represents a logic "1". For example, the high resistive state may represent a logic "0" while the low resistive state may represent a logic "1". Other configurations of data storage for the ReRAM may also be useful.

The RM may be a material which can form filaments. For example, the RM may be a non-stoichiometric metal oxide layer, such as hafnium oxide ($HfO_2$) or tantalum oxide ($TaO_x$ or $Ta_2O_x$, where x is not an integer) layer. Other types of RMs may also be useful. A RM is subjected to a forming procedure which creates conduction paths or filaments. The filaments can be reset or broken by subjecting the fin to a reset procedure or condition; the filaments can be set or re-formed by subjecting the RM to a set procedure or condition. A reset RM with broken filaments results in a high resistive state (e.g., logic "0") while a set RM with formed or re-formed filaments results in a low resistive state (e.g., logic "1").

Generally, the SET and RESET currents for RM are in the opposite direction. For example, the RM uses bipolar currents for SET and RESET. One polarity may be provided at the BL while the other may be provided at the SL. Providing unipolar currents for SET and RESET may also be useful.

As for the magnetic resistive material (MRM), it is a magnetic material having first and second resistive states. The resistive states may depend on the magnetization polarity or direction of the MRM. In one embodiment, the MRM includes first and second MRM layers, one with fixed magnetic field (fixed or pinned layer) and one with active or switchable magnetization polarity or direction (active or free layer). A tunneling layer may be provided between the first and second MRM layers, forming a MR stack. The free MRM layer may be, for example, CoFeB, the tunneling layer may be MgO or $Al_2O_3$ and the pinned layer may be CoFeB/Ru/CoFeB. Other types of MRM stack may also be useful.

Switching of the magnetization direction of the free layer may be achieved by applying a spin polarized current into the active layer. Depending on the direction of the current, the magnetization direction switches from one direction to the other. For example, bidirection or bipolar currents are used to switch the magnetization direction of the free layer to the desired direction. As such, the SET and RESET currents are in the opposite direction. In one embodiment, a high resistive state is produced when the active and fixed layers have opposite magnetization direction (reset) and a low resistive state is produced when the free and pinned layers have coincident magnetization direction (set). One resistive state represents a logic "0" while the other resistive state represents a logic "1". For example, the high resistive state may represent a logic "0" while the low resistive state may represent a logic "1". Other configurations of data storage for the STT-RAM may also be useful.

The RM and MRM elements may be accessed similarly to that of the PCM elements. For example, a programming access may include applying SET and RESET signals to the BLs while read signal is applied for a read access. The actual values and parameters may vary, depending on the material used. For example, the programming signals should be sufficient to perform setting and resetting the elements into low and high resistive states while the read signal does not affect the current state of the elements.

Figure 2A:
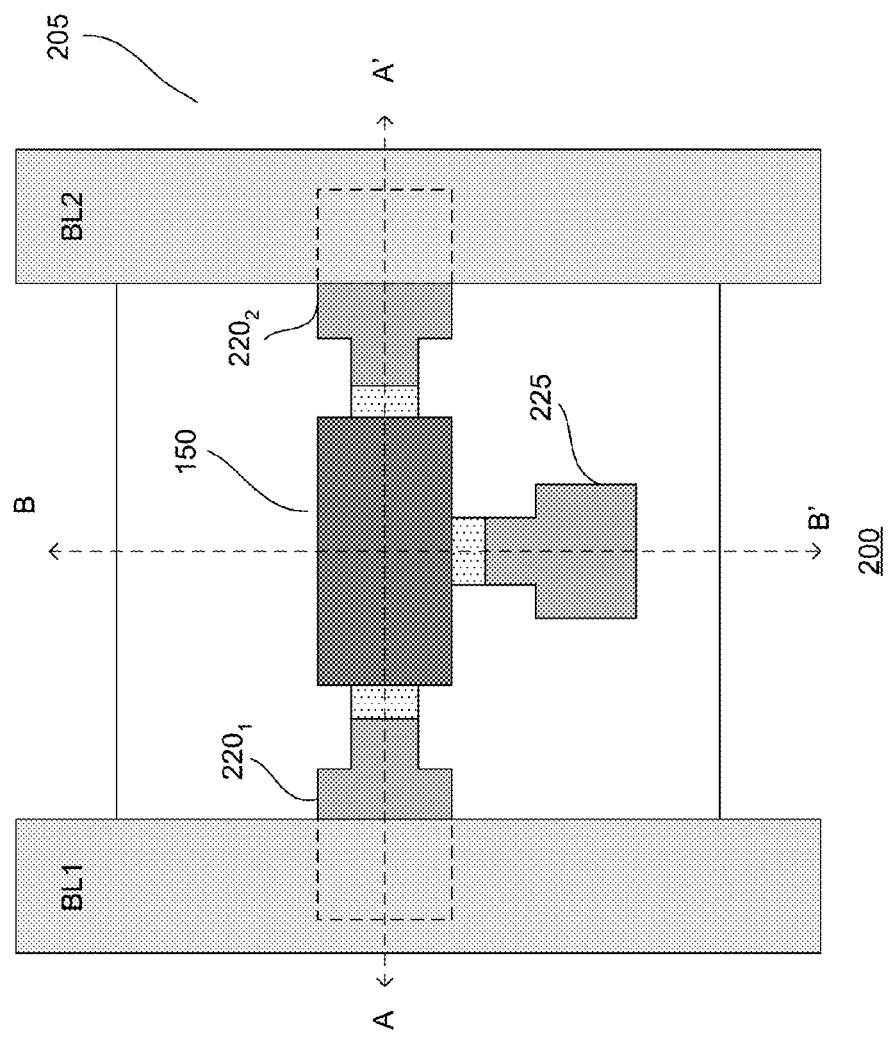
FIGS. 2a-c show various views of an embodiment of a device.
Figure 2B:
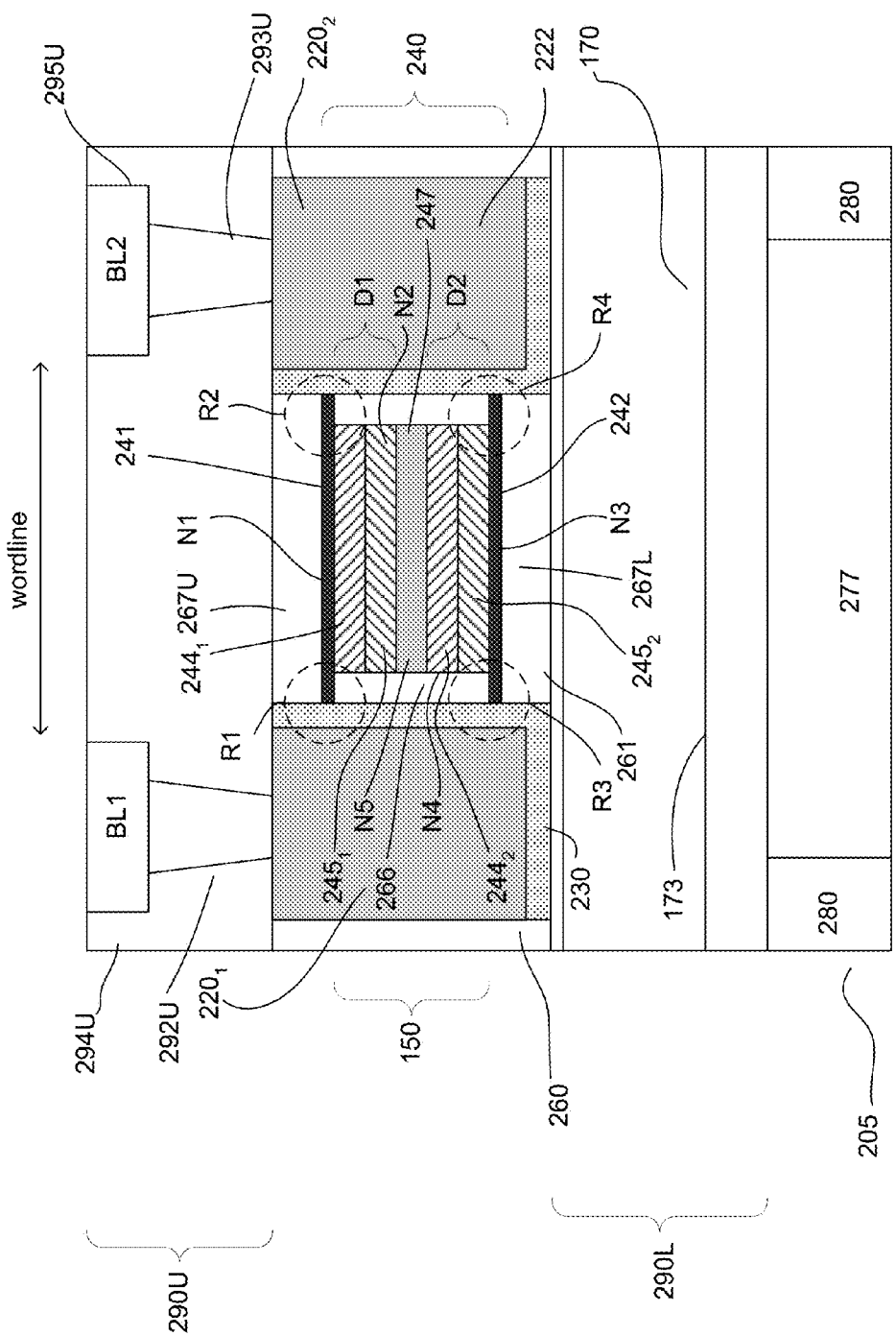
Figure 2C:
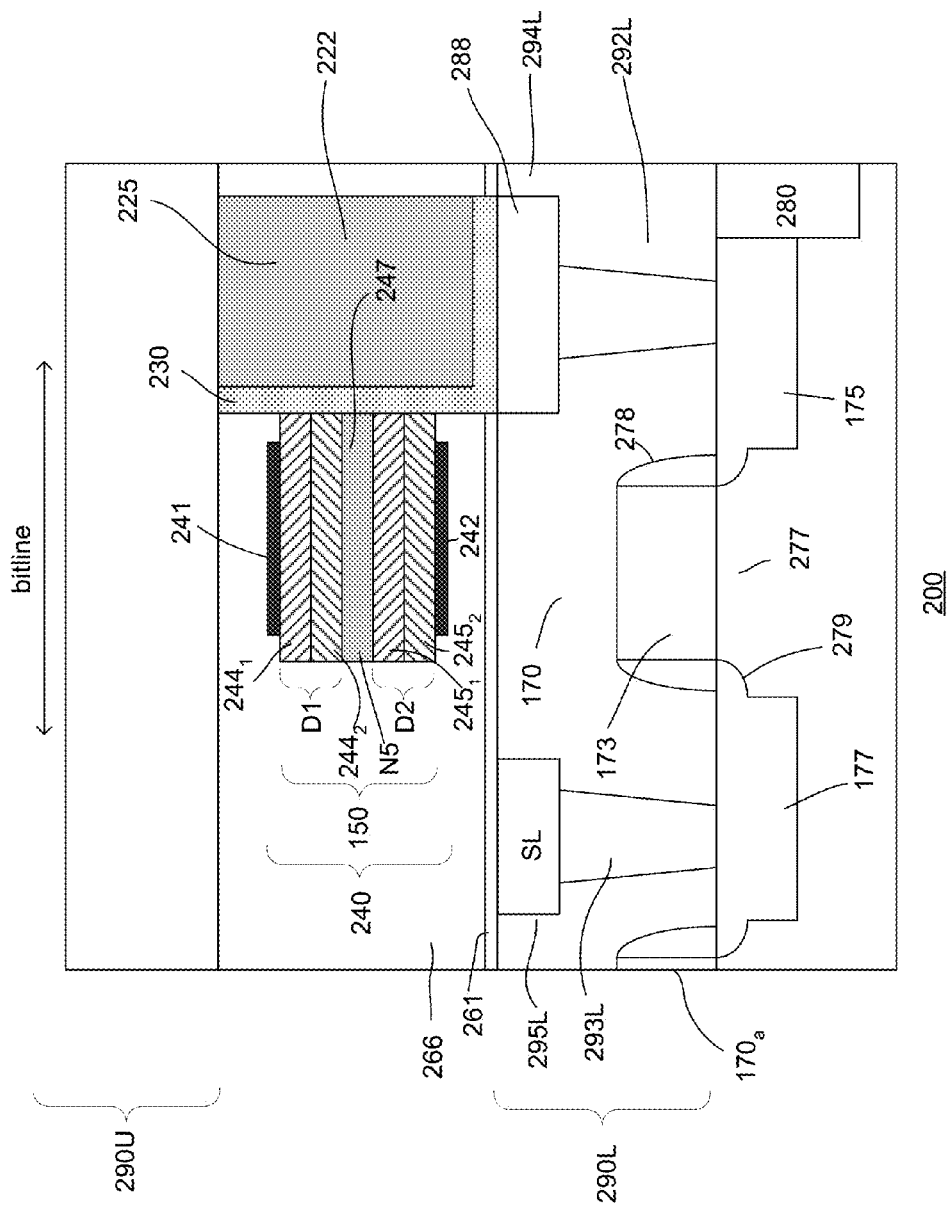

FIGS. 2a-c show various views of an embodiment of device. FIG. 2a shows a top view of the device. The top view omits upper dielectric layers, including dielectric layer 267. FIG. 2b shows a cross-sectional view of the device along a first direction between A and A' and FIG. 2c shows a cross-sectional view of the device along a second direction between B and B'. The first and second directions, for example, are orthogonal to each other. As shown, the first direction is along a wordline direction and the second direction is along a bitline direction.

The device includes a memory cell 200. In one embodiment, the memory cell is a multi-bit memory cell. For example, the multi-bit memory cell is similar to the memory cell described in FIG. 1a. Common elements may not be described or described in detail.

The memory cell is disposed on a substrate 205. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator substrate. For example, the surface and bulk crystalline layers are single crystalline silicon. Other types of COI substrates may also be useful. It is understood that the surface and bulk layers need not be the same material.

The memory cell includes a cell stack 240. The cell stack, for example, forms the storage unit of the memory cell. The cell stack, in one embodiment, is disposed between two inter-level dielectric (ILD) layers on the substrate. For example, the cell stack is disposed between upper and lower ILD layers 290U and 290L. The ILD layers may be formed of silicon oxide. Other types of dielectric materials may also be useful for the ILD layers. It is understood that the different ILD layers need not be formed of the same material or have the same configuration.

An ILD layer includes a metal level and a contact level. For example, the upper ILD layer includes an upper metal level 294U and an upper contact level 292U while the lower ILD layer includes a lower metal level 294L and a lower contact level 292L. Metal levels include conductors while contact levels include contacts. For example, upper metal level includes upper conductors 295U, upper contact level includes upper contacts 293U, lower metal level includes lower conductors 295L and lower contact level includes lower contacts 293L. The conductors and contacts may be formed of a metal, such as copper, copper alloy, aluminum, tungsten or a combination thereof. Other suitable types of metal, alloys or conductive materials may also be useful.

In one embodiment, the lower metal level is the first metal level M1 and the upper metal level is a second metal level M2 of the device. In such case, the lower contact level is a pre-metal dielectric (PMD) or contact (CA) level and the upper contact level is a first via level V1. Contacts at the PMD level may be tungsten contacts while contacts at the V1 level may be copper or copper alloy. Other types of conductive materials, such as aluminum, may also be useful. Other configurations of contacts at the contact levels may also be useful.

Figure 2D:
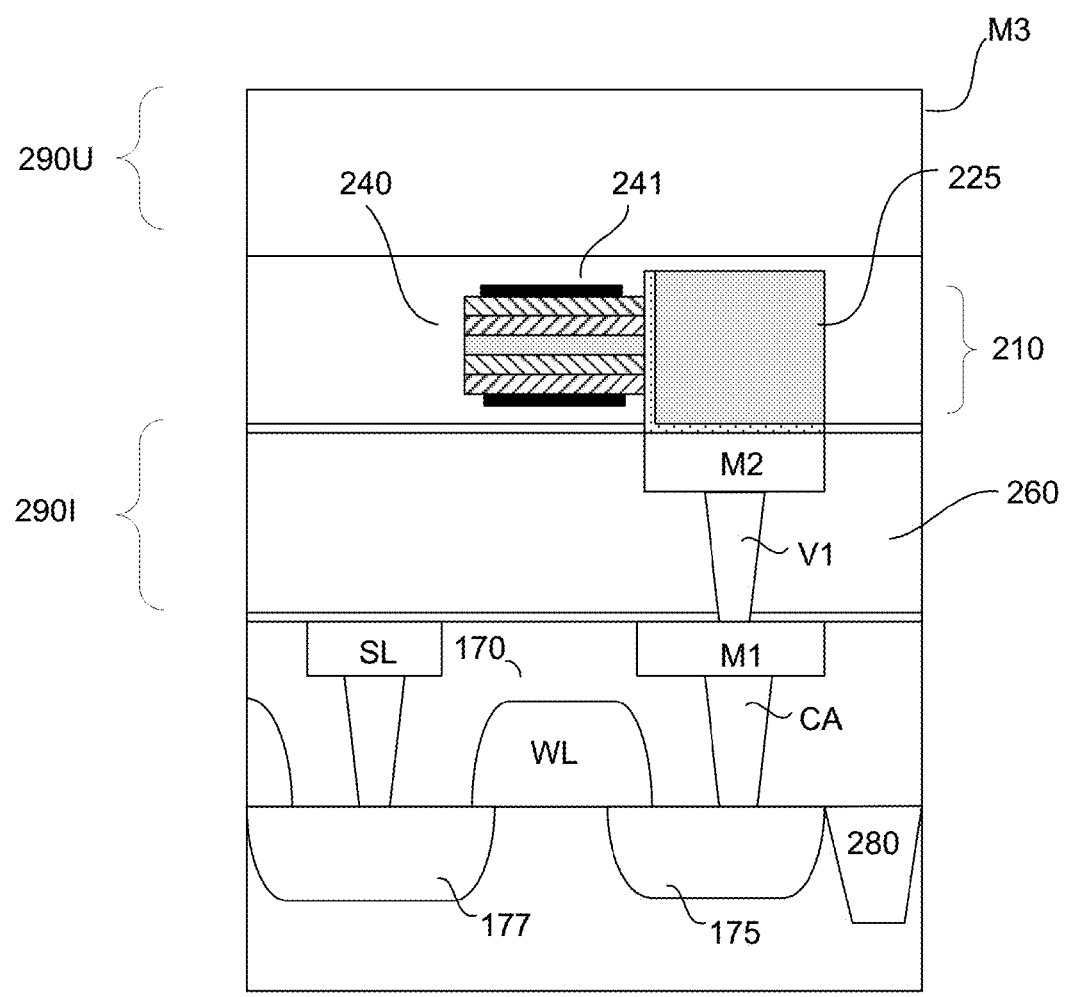
FIG. 2d shows a cell stack disposed between two adjacent metal layers.
Figure 2E:
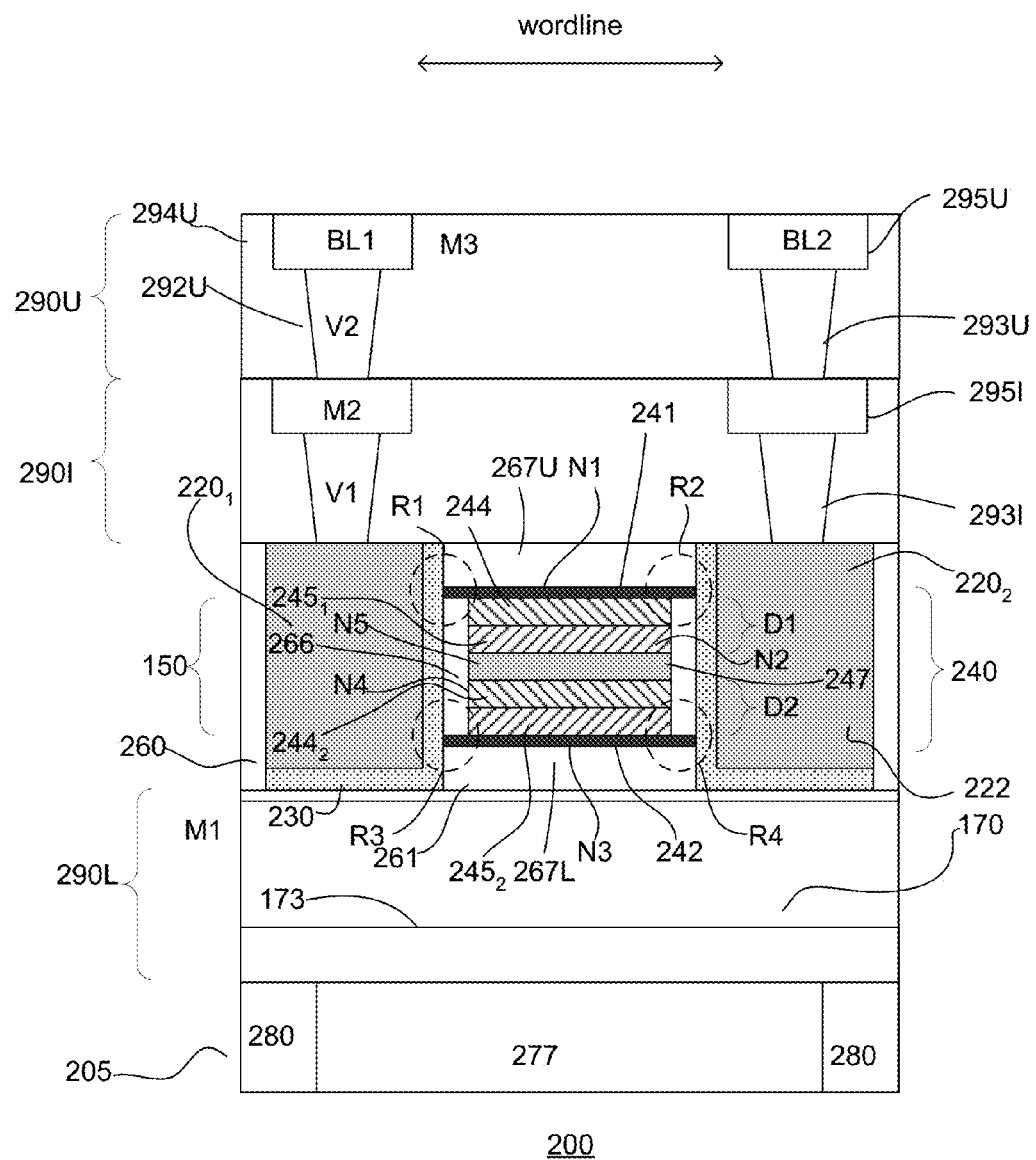
FIG. 2e shows a cell stack disposed between two non-adjacent metal layers.

In general, the cell stack may be disposed between any two metal levels of the device. For example, the cell stack may be disposed between any two metal layers, such as M2 and M3, as shown in FIG. 2d. Disposing the cell stack between other metal levels may also be useful. Preferably, the cell stack is disposed between two adjacent metal layers. Disposing the cell stack between non-adjacent metal layers may also be useful. For example, the cell stack may be disposed between M1 and M3, as shown in FIG. 2e. Disposing the cell stack between other non-adjacent metal levels may also be useful. Contacts may be provided in an intermediate ILD level 290I to facilitate connections between two non-adjacent metal layers 290L and 290U. The contact may be a direct contact or a contact at the via level and a metal pad at the metal level, as shown. Other contact configurations may also be useful.

The cell stack is disposed within a cell dielectric layer 260 located between the lower metal level and upper contact level. The cell dielectric layer may be formed of silicon oxide. Other types of dielectric materials may also be useful for the cell dielectric layer. The cell dielectric layer may be formed of different dielectric layers. The different dielectric layers may be formed of the same material. Providing the dielectric layers with different materials may also be useful. For example, low k dielectric materials may be used. In some cases, bad thermal conducting dielectric materials may be used, for example, to reduce thermal cross-talk. Other configurations of the dielectric layers may also be useful. The cell dielectric layer, for example, may be considered part of the upper ILD layer.

In one embodiment, a dielectric liner 261 is disposed between the cell dielectric and stack dielectric layer 266. The dielectric liner, for example, may serve as an etch stop layer. In one embodiment, the dielectric liner is formed of a low k dielectric. For example, the dielectric liner may be nBLOK. Other types of dielectric materials for the dielectric liner may also be useful.

The cell stack, as shown, includes top and bottom cell stack layers 241 and 242 disposed above and below a secondary selector stack 150. The top and bottom cell stack layers serve as node N1 and N3 of the storage unit. The top and bottom cell stack layers may include capping or protective layers between the secondary selector stack. For example, one or more capping layers are provided on the top surface of the bottom cell stack layer and on the bottom surface of the top cell stack layer. The capping layers may be employed to reduce oxidation or poor interface viscosity between layers. Providing capping layers on both top and bottom sides of the top and bottom cell stack layers may also be useful. The capping layer, for example, may be silicon nitride or silicon oxynitride. Other types of capping layers, such as Ti/Ta or Co/Pd layers. Other types of capping layers, such may also be useful. The type of capping layer, for example, may depend on the type of cell stack layer.

The secondary selector stack, in one embodiment, includes layers of first and second secondary selectors. The first and second secondary selectors, in one embodiment, include first and second diodes D1 and D2. Other types of secondary selectors may also be useful. As shown, a first upper diode layer $244_1$ and first lower diode layer $245_1$ for the first diode D1 and a second upper diode layer $244_2$ and a second lower diode layer $245_2$ for the second diode D2 are provided between the top and bottom cell stack layers. The diode layers of a diode are oppositely doped semiconductor layers. For example, one of the diode layers is a p-type doped polysilicon layer while the other is a n-type doped polysilicon layer. Other types of diode layers may also be useful. In one embodiment, the upper diode layers are p-type layers and the lower diode layers are n-type diode layers. Providing n-type upper diode layers and p-type lower diode layers may also be useful.

Between D1 and D2 is a bit selector connection layer 247 for connecting the diodes. The connection layer, for example, is formed of an electrical connection material (ECM). Various types of ECMs may be useful. The ECM should be a high conductivity material. The use of a high conductivity material reduces resistance. The ECM may also have low thermal conductivity. In one embodiment, the first ECM includes titanium nitride (TiN). Other types of ECMs may also be useful.

As shown, first sides of secondary selector stack along the first or wordline direction are recessed from opposing first sides of the top and bottom cell stack or node layers. This allows bitline (BL) connection units $220_1$ and $220_2$ to be disposed on opposing first sides of the cell stack to contact the top and bottom cell stack layers without contacting the secondary selector stack. The BL connection units are employed to connect BL1 and BL2 to the cell stack. Separating the sides of the secondary selector stack from the BL connection units is a stack dielectric layer 266. A lower bit stack dielectric layer 267L is provided below the bottom cell stack layer to separate it from the dielectric liner. An upper bit stack dielectric layer 267U is provided above the top cell stack layer. The upper bit stack dielectric layer has a top surface which is coplanar to the top surfaces of the BL connection units.

In one embodiment, a BL connection unit includes a bulk connector 222 and a connector liner 230. The connector liner lines at least a side of the bulk connector adjacent to the first side of the cell stack. As shown, the connector liner lines the bottom and the side of the bulk connector adjacent to the first side of the cell stack. The bulk connector facilitates connection to the BL while the connector liner is connected to the top and bottom cell stack layers at the opposing first sides of the cell stack. The bulk connector and liner are formed of ECMs. The ECM of the bulk connector preferably is a high conductivity material, such as TiN. Other types of high conductivity ECMs may also be useful.

As for the connector liner, it is formed of an ECM. In one embodiment, the connector liner may be formed of an ECM with high conductivity and/or low thermal conductivity. The liner may be formed of a plurality of ECM layers, forming a connector liner stack. For example, the connector liner may be formed of ECM layers having high conductivity and low conductivity.

In embodiment, a BL connection unit may include a neck portion which is narrower than the main portion. For example, the neck portion is narrower than the main portion along the bitline direction. The neck portion of the BL connection unit contacts the top and bottom cell stack layers. Providing a neck portion advantageously reduces the cross-sectional area of the interface between the BL connection units and cell stack layers.

In one embodiment, the connector liner may include a thin insulator layer between it and the top and bottom cell stack layers. For example, a thin silicon oxide layer may line the side of the connector liner adjacent to the first side of the cell stack. The thin insulator layer may serve as a high voltage breakdown layer for initializing the procedure for the memory cell. For example, the thin insulator layer may be used to reduce the cross-sectional area of the interface of the cell stack layers to the BL connection units. This improves programming efficiency. Other configurations of connector liners may also be useful.

The top and bottom cell stack or node layers are recessed back from the secondary selector stack at least for one of the second opposing sides of the cell stack. For example, the cell stack layers are recessed from at least the second side of the cell stack which contacts a cell connector 225. This allows the cell connector 225 to be coupled to the bit selector connection layer or secondary selector stack without contacting the top and bottom cell stack layers. Providing cell stack layers recessed from both second opposing sides of the cell stack may also be useful. The cell connector may be formed of an ECM. Preferably, at least the portion of the cell connector in contact with the secondary selector stack is formed of an ECM with high conductivity. In one embodiment, the cell connector is similar to the BL connection units. For example, the cell connector includes a bulk connector 222 and a liner 230. Providing cell connectors which are similar to the connection units simplifies processing. Other configurations of the cell connector may also be useful. The cell connector, as shown, penetrates the dielectric liner. For example, the liner lining a bottom of the bulk connector penetrates the dielectric liner. This facilitates connection to the metal level in the lower ILD.

A primary selector 170 is provided. The primary selector may be provided on the substrate. In one embodiment, the primary selector is a MOS transistor. Other types of primary selectors, such as BJT or diodes, may also be useful. The MOS transistor includes a gate 173 and first and second S/D regions 175 and 177 in the substrate adjacent to the gate. The S/D regions may include lightly doped (LD) regions 279. The first S/D region, for example, serves as a drain while the second S/D region serves as a source. In one embodiment, the source is a common source region for an adjacent transistor of an adjacent row. The gate may include dielectric sidewall spacers 278.

In one embodiment, the source is coupled to a SL. For example, the source is coupled to the SL via a contact. As for the drain, it is coupled to the cell connector. For example, a contact at the via or contact level and a pad at the metal level may be provided to couple the cell connector to the drain. Other configurations of coupling the SL and cell connector may also be useful.

Isolation regions 280 are provided. In one embodiment, the isolation region is a shallow trench isolation (STI) region. Other types of isolation regions may also be useful. The isolation regions are provided to separate columns of memory cells in the bitline direction and adjacent drain regions of select transistors of memory cells in the wordline direction.

The lower ILD layer is disposed on the substrate covering the primary selector. In one embodiment, contacts are provided to the S/D regions. A SL is disposed in the lower metal level and coupled to the second S/D region by a source contact. As for the first S/D region, a drain contact couples it to a drain connector 288 in the lower metal level. The drain connector is coupled to the cell connector. This enables the primary selector to be coupled to N5 of the cell stack via the cell connector.

The upper ILD layer is disposed over the cell dielectric layer. The upper metal level includes first and second bitlines BL1 and BL2. The first and second BLs are coupled to first and BL connection units by first and second bitline contacts in the upper contact level. This allows the BL1 to be coupled to N4 and BL2 to be coupled to N2.

As discussed, one embodiment of the memory cell is a PCRAM cell. In the case of a PCRAM cell, the top and bottom cell stack layers are resistive layers. The resistive layers form resistive elements R1, R2, R3 and R4. As shown, the top cell stack layer forms R1 and R2 while the bottom cell stack layer forms R3 and R4. The resistive layers, in one embodiment, are PCM layers. The PCM layers, for example, may be formed of a chalcogenide material. In one embodiment, the chalcogenide material is a germanium-antimony-tellurium (GeSbTe) alloy. In one embodiment, the chalcogenide material is $Ge_2Sb_2Te_5$ (GST). Other types of chalcogenide or PCMs may also be employed. Providing other types of PCM layers may also be useful. The PCM layers may include one or more capping or protective layers on top and/or bottom surfaces. The protective layers reduce oxidation and/or improve interface forming. The capping layer or layers may be, for example, silicon nitride or silicon oxynitride. Other types or functions of capping layers may also be useful.

The BL connection units serve as programming units. The bulk connector of a programming unit is used to connect to a BL. The bulk connector may be formed of an ECM with high conductivity. For example, the connector may be formed of TiN. Other types of materials with high conductivity may also be used to form the connector.

As for the liner of a BL connection unit, it serves as a programmer. A programmer is employed to program the PCM layers. For example, the programmer is used to SET and RESET the PCM layers. The programmer also facilitates read accesses. The programmer, for example, is a heater which is used to SET and RESET the PCM layers.

In one embodiment, the liner is a liner stack, having multiple liner layers. For example, the liner stack may be a 2 or 3 layered stack. Providing the liner stack having other number of layers may also be useful. The liner stack may be formed of ECMs. The liner may be configured to be in direct contact with the PCM or disposed between an ECM with high conductivity. For example, the liner may be a 2 layered stack, such as TiN/TaN, with TaN in direct contact with the PCM or a 3 layered stack, such as TiN/TaN/TiN, with TiN in direct contact with the PCM. Other configurations of the liner may also be useful.

In one embodiment, the ECM layer of the liner with bad thermal conductivity may act as a heat shield. For example, in the case where an ECM layer with high conductivity, it serves as a heater while the ECM layer with bad thermal conductivity serves as a heat shield. For example, the TiN layer which contacts the cell stack layers serves as a heater while the TaN layer serves as a heat shield to improve heating efficiency of the heater. In other cases, the ECM layer with bad thermal conductivity serves as both a heater and a heat shield. For example, a TaN layer of the liner may contact the cell stack layers. Other configurations of the liner may also be useful.

A thin insulator layer may be disposed on the side of the liner adjacent to the first side of the cell stack. The insulator, for example, may be silicon oxide. The thin insulator layer may serve as a high voltage breakdown layer for initializing the memory cell. As for the liner on top of the cell connector, it may be TaN or other ECM materials with bad thermal conductivity. Other types of the liner may also be useful.

In some embodiments, to further increase programming efficiency, the PCM layers may be doped with insulating islands. For example, the PCM layers may be doped with silicon oxide or other insulating materials. The presence of the insulating islands in the PCM layers effectively lowers the contact area between the PCM layers and liner, making current crowding effect more obvious. As a result, a lower programming (heating) current is needed for achieving melting and crystallization temperatures. Reduced programming current facilitates the use of smaller transistors, thereby reducing cell size. Alternatively, the PCM layers may be doped with heating islands, such as an ECM with high conductivity. For example, the ECM may be TiN. The heating islands act as heaters within the PCM layers and to reduce the heat loss during the heating of the PCM layers contacting the BL connection units, therefore improving heating efficiency. The insulating or heating islands may be incorporated into the PCM layers by, for example, in situ doping. Other techniques for incorporating the insulating or heating islands, such as by ion implantation, may also be useful. The islands may be about 10-20 mole percent of the PCM layers. Other mole percentages may also be useful.

The contact surface of a resistive element to the heater, as described, can be designed to be small. For example, the contact surface of a resistive element to the heater is defined by the cross-sectional area of the top or bottom cell stack or PCM layers. Providing a resistive element with small contact surface to the heater reduces the SET and RESET current needed to program the resistive element, reducing power consumption. Additionally, reduced programming currents results in the need of a smaller primary selector, resulting in smaller cell size which facilitates higher density.

In other types of resistive memory cells, the top and bottom cell stack layers may serve as electrode layers for one electrode of the resistive elements R1, R2, R3 and R4. For example, in the case of a 2-terminal based RAM cell which uses a resistor's changeable resistance to represent a "0" or a "1", such as a ReRAM or a STT-RAM, the top and bottom cell stack layers serve as electrode layers for electrodes of the resistive elements. As for the liner layer, it includes one or more layers used for the storage elements. Additionally, it may also include an electrode layer between the bulk connector and the storage layers, serving as another electrode of the resistive elements.

In the case of a ReRAM cell, the top and bottom cell stack layers serve as electrodes. The electrode layers, for example, are formed of platinum (Pt) or iridium (Ir). Other types of electrode layers may also be useful. As for the liner, it includes a resistive layer which can form filaments, such as a non-stoichiometric metal oxide. For example, the resistive may be $Ta_2O_{5-x}$ or $TaO_x$, where x is not an integer. Other types of resistive materials which can form filaments may also be useful. The liner also includes an electrode layer, such as Pt or Ir, forming the liner stack. The electrode layer of the liner stack contacts the bulk connector while the resistive layer contacts the electrode layers of the cell stack.

A thin insulator layer may be disposed on the side of the liner adjacent to the first side of the cell stack. The insulator, for example, may be silicon oxide. The thin insulator layer may serve as a high voltage breakdown layer for initializing the memory cell.

In the case of a STT-RAM cell, the cell stack layer, similar to ReRAM, serves as an electrode. The cell stack layer, for example, is formed of PtMn, IrMn, or Co/Pd. Other types of electrode materials may also be useful. As for the liner, it includes a MRM stack. The MRM stack includes first and second MRM layers separated by a tunneling layer. The first MRM layer, for example, is a fixed or pinned layer having a fixed magnetization polarity while the second MRM is a free layer with a switchable magnetization polarity. In one embodiment, the pinned layer is CoFeB, the tunneling layer is MgO or $Al_2O_3$, and the free layer is a stack which includes CoFeB/Ru/CoFeB. Other configurations of MRM stack may also be useful. The first or second MRM layer may be configured to contact an end of a cell stack layer. An electrode layer may be disposed between the MRM layer and bulk connector.

The contact surface of a resistive element to the electrode of the ReRAM or STT-RAM cell, like the PCRAM cell, can be designed to be small. For example, the contact surface of a resistive element is defined by the cross-sectional area of the top or bottom cell stack or electrode layers. Providing a resistive element with small contact surface to the electrodes reduces the SET and RESET current needed to program the resistive element, reducing power consumption. Additionally, reduced programming currents results in the need of a smaller primary selector, resulting in smaller cell size which facilitates higher density.

Figure 2F:
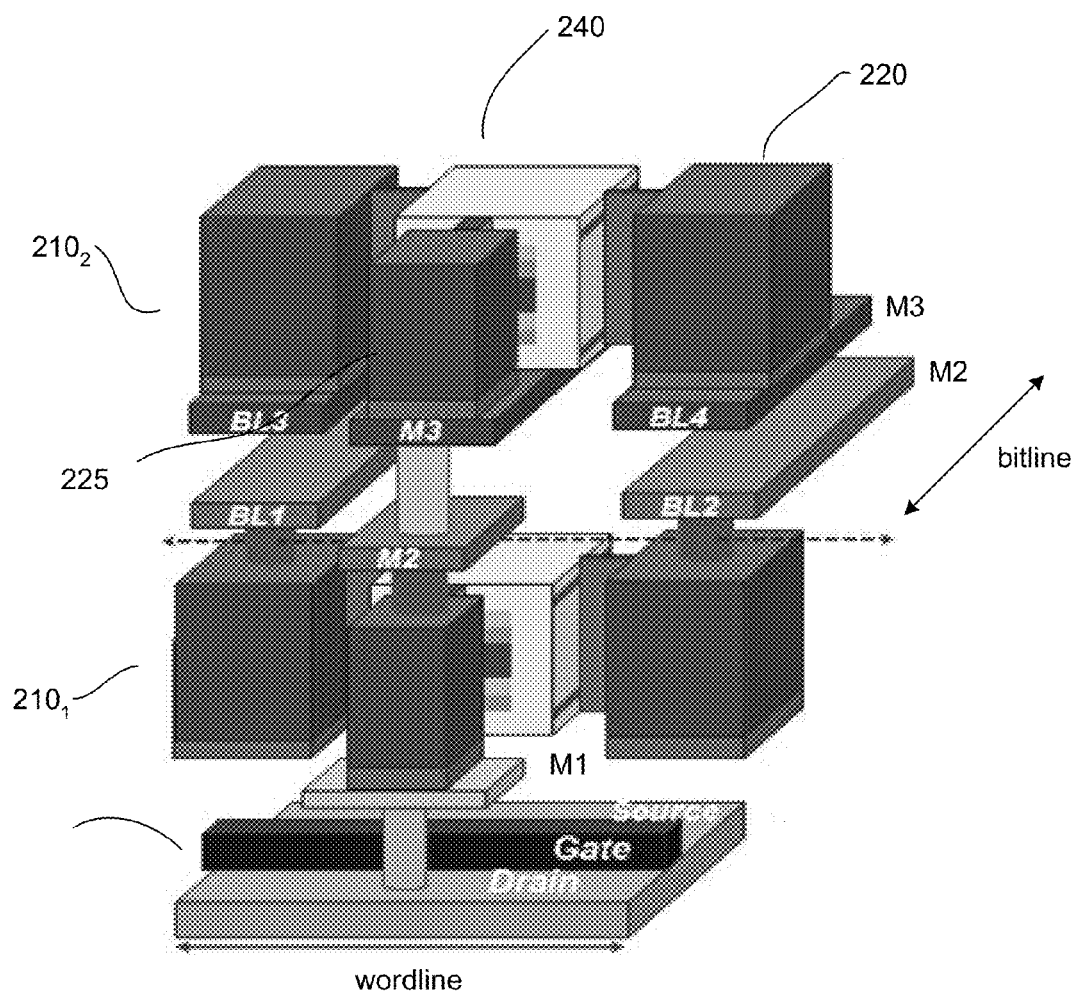
FIG. 2f shows an alternative embodiment of a memory cell.

FIG. 2f shows an alternative embodiment of a memory cell 201. As shown, the memory cell includes a primary selector 170 coupled to first and second storage units 210. The storage units $210_1$ and $210_2$ are stacked one above another. It is understood that the additional storage units may be stacked similarly as shown. Stacking storage units increases bit density or decreases bit per area. In such cases, a primary selector selects x storage units, where x is the number of storage units in the stack. As such, a primary selector is associated with x storage units and $2^x$ bitlines.

Figure 2G:
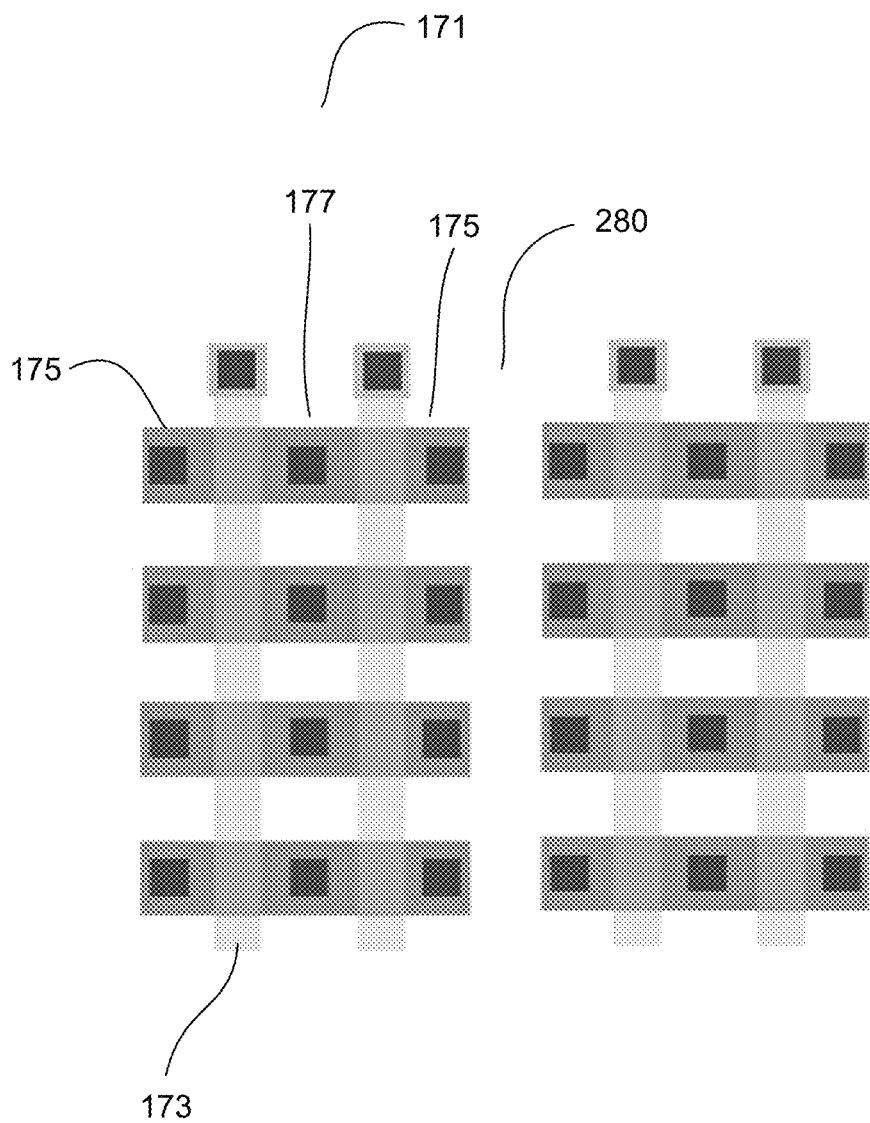
FIG. 2g shows a simplified layout of a portion of an embodiment of a memory array.

FIG. 2g shows a simplified layout of a portion of an embodiment of a memory array 205 with four rows of memory cells 100. The layout, for example, is prior to M1. As shown, transistors of two adjacent rows share a common source region 177 while having non-common drain regions 175, forming a transistor pair 171. Contacts are provided for the drain and source regions. A plurality of transistor pairs is arranged in the row and column directions. The transistor pairs are separated from each other by isolation regions 280. Gate conductors 173 are disposed on the substrate and traverse the transistor pairs in the row direction. The gate conductors, for example, are polysilicon gate conductors.

Figure 2H:
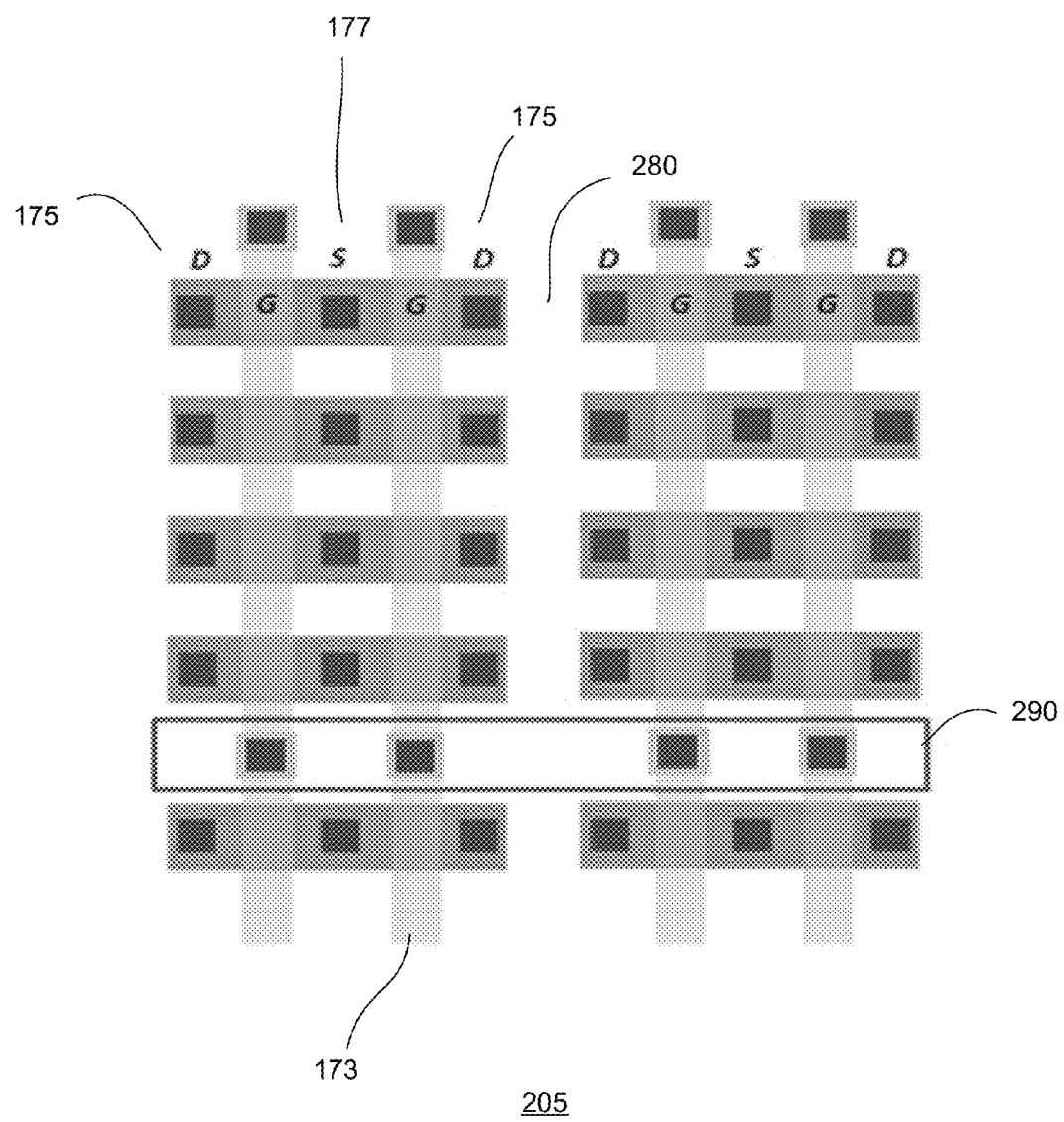
FIGS. 2h-i show simplified layouts of a portion of another embodiments of a memory array.
Figure 2I:
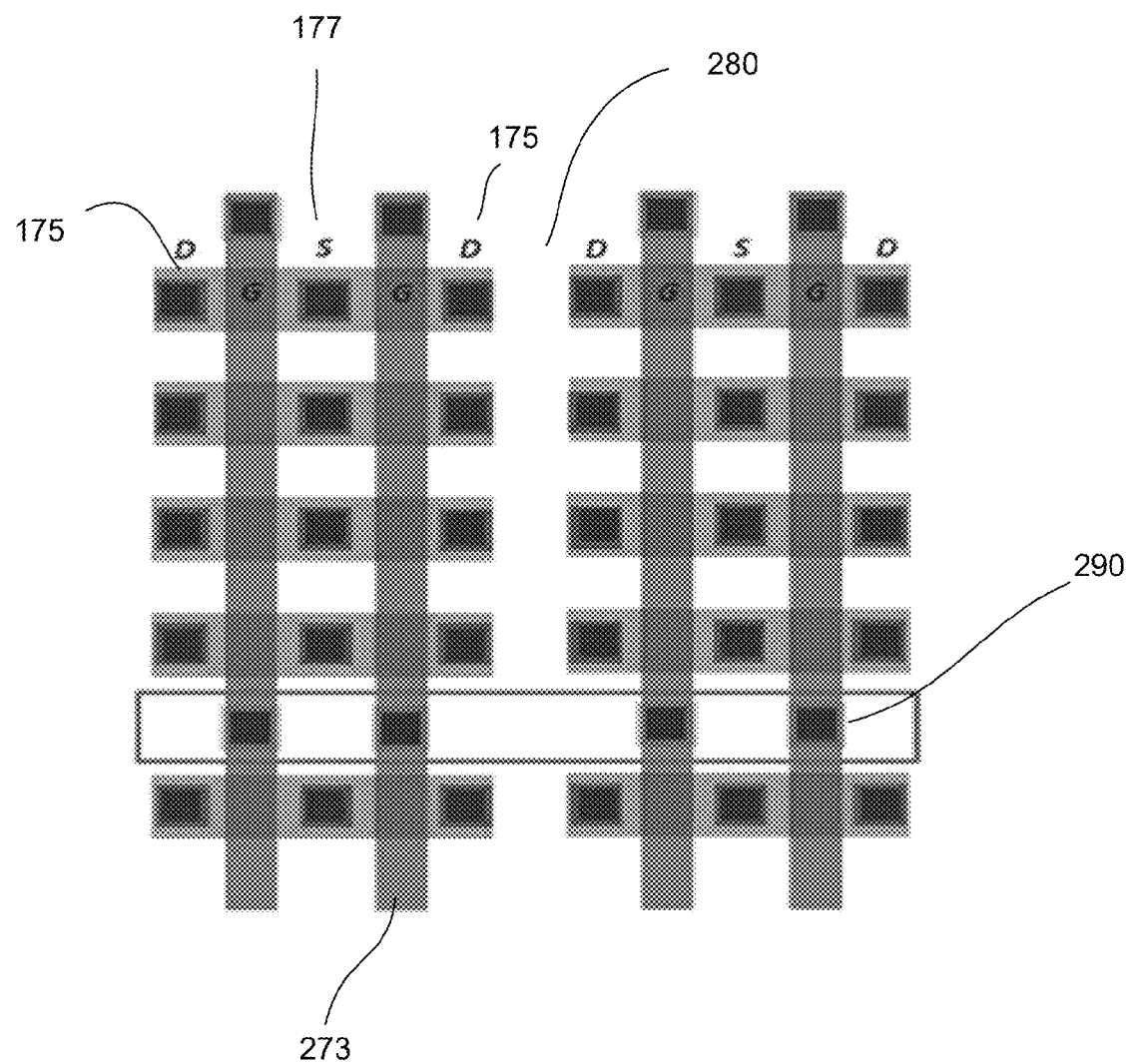

FIGS. 2h-i show a simplified layout of a portion of another embodiment of a memory array 205 with four rows of memory cells prior to and after, for example, M1. The layout is similar to that described in FIG. 2g. Common elements may not be described or described in detail. In the case of a large array, a row may include a large number of cells. For example, a row may include 256, 512 or even more memory cells. Other number of memory cells may also be useful.

In the case where a large number of memory cells are provided in a row, strap cells 290 may be provided. Strap cells, for example, are contacts which connect wordlines 273 in a metal level to the gate. Providing wordlines at other metal levels may also be useful. The use of strap cells to stitch connections between the wordlines and gate increases array performance. Strap cells, for example, may be provided at every 16 or 32 cells in the rows. Providing strap cells at other number of cells may also be useful.

In the case where strap cells are employed, it is preferable to avoid SLs and BLs in the same level. For example, WLs are provided in M1, SLs in M2 and BLs in M3, with storage units disposed between M2 and M3. Additional storage units may be stacked in metal levels above M3. Other configurations of WLs, SLs, BLs and storage units may also be useful. In the case of an array without strap cells, such as in the case of a small array, WLs are the gates, SLs are located in M1 and BLs are located in M2, with the storage units between M1 and M2. Additional storage units may be stacked in metal levels above M2. Other configurations of WLs, SLs, BLs and storage units may also be useful.

As described, the memory cell is flexible. For example, the memory cell can be configured as a dual-bit memory cell with dual-port function or a single port four-bit memory cell. Multi-bit memory cell with dual ports improves performance. Furthermore, providing multi-bit memory cells facilitates forming high density memory arrays without incurring large area. Additionally, the memory cell includes four resistive elements via four terminals, with two terminals sharing a via. This advantageously facilitates providing a compact memory cell. Although the memory cell may require additional reticles, these are non-CD reticles. The use of non-CD reticles increases uniformity, which increases chip capacity as well as reducing cost.

Figure 2J:
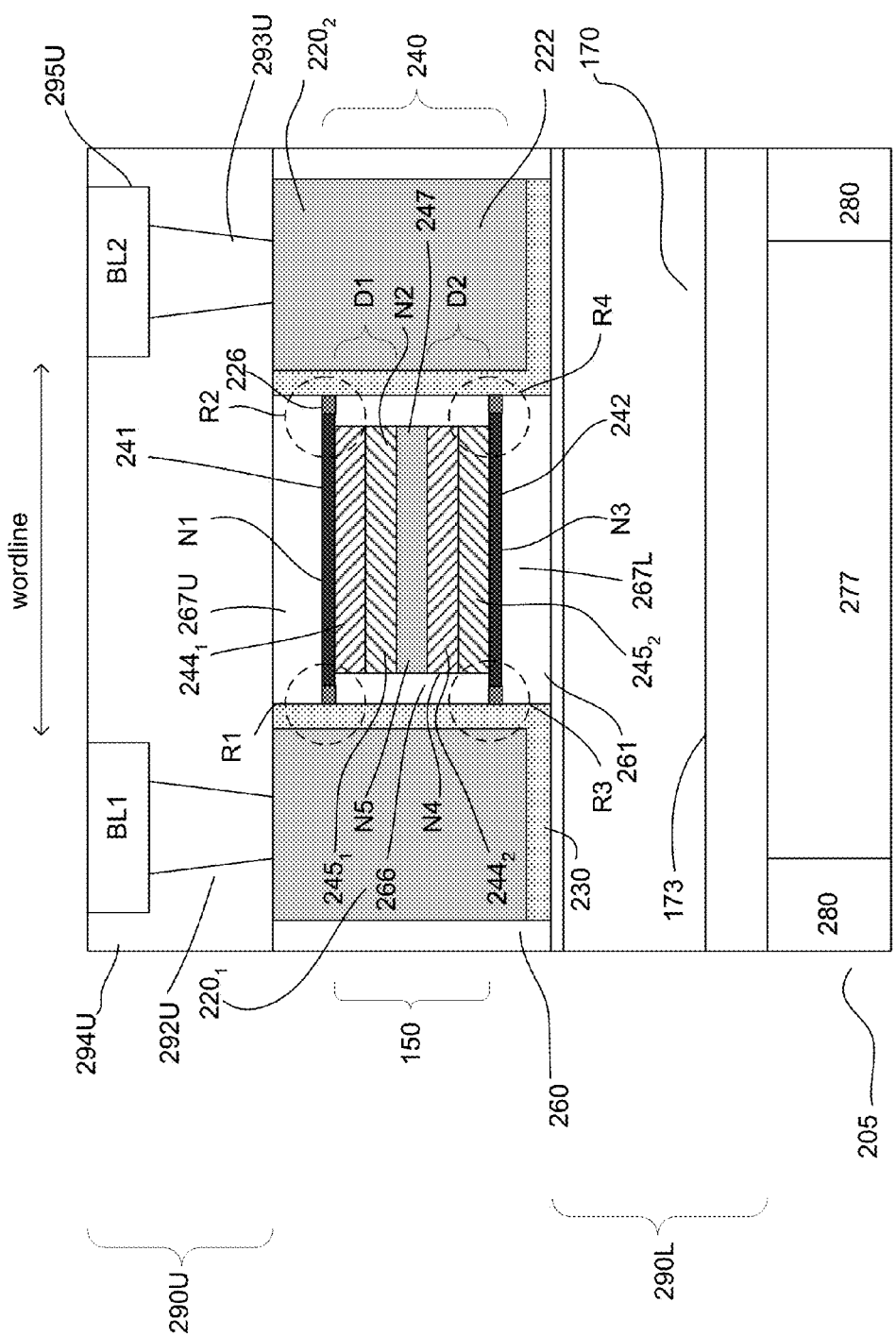
FIG. 2j shows a cross-sectional view of another embodiment of a device.

FIG. 2j shows another embodiment of a memory cell 200. The memory cell is similar to that described, for example, in FIGS. 2a-c. Common elements may not be described or described in detail. The memory cell, in one embodiment, is a PCRAM cell. As shown, the top and bottom cell stack layers 241 and 242 are connected to BL connection units by cell stack connectors 226. The cell stack connectors, for example, serve as heaters. In one embodiment, the cell stack connectors serve as heaters for the PCRAM cell. The cell stack connectors, for example, are formed of an ECM. The cell stack connectors, in one embodiment, are formed of an ECM with high conductivity, such as TiN. Other types of ECMs may also be useful. In such cases, the connector liner 230 may be formed of an ECM having bad thermal conductivity. For example, the connector liner may be TaN. Other types of ECMs or a combination of ECMs may also be useful for the connector liner. In one embodiment, thin insulator layer may be disposed on the side of the liner of the BL connection units adjacent to the first side of the cell stack. As such, the insulator layer is in contact with the cell stack connectors. The insulator, for example, may be silicon oxide. The thin insulator layer may serve as a high voltage breakdown layer for initializing the memory cell.

FIGS. 3a-m show cross-sectional views of a process of forming an embodiment of a device 300. The process includes forming a memory cell. The memory cell, in one embodiment, is a resistive-type memory cell. The memory cell is similar to that described in FIGS. 2a-c. Common elements may not be described or described in detail. The cross-sectional views are along the wordline direction. Although the cross-sectional views show one memory cell, it is understood that the device includes a plurality of memory cells of, for example, a memory array.

Referring to FIG. 3a, a substrate 205 is provided. The substrate, for example, is a semiconductor substrate, such as a silicon substrate. Other types of semiconductor substrates, including silicon-germanium (SiGe), germanium (Ge), gallium-arsenic (GaAs) or any other suitable semiconductor materials as well as COI, may also be useful. The substrate may include a substrate component level. The substrate component level may include circuit components, such as transistors. Other circuit components may also be useful. In other embodiments, the transistor may be a BJT. Other types of cell selectors may also be useful.

In one embodiment, the substrate includes a cell selector 170 for the memory cell. The cell selector, in one embodiment, is a transistor having a gate 173 disposed on a substrate between first and second S/D regions in the substrate. A channel 277 of the transistor is disposed below the gate between the S/D regions. The gate, as shown, is a gate conductor which is a common gate for a row of memory cells in the wordline direction.

A lower ILD layer 290L is disposed over the substrate covering the cell selector. Contacts are provided to the S/D regions in the contact level of the lower ILD layer. A SL is disposed in the lower metal level of the lower ILD layer and coupled to the second S/D region by a source contact. As for the first S/D region, a drain contact couples it to a drain connector in the lower metal level.

Isolation regions 280 are prepared. In one embodiment, the isolation region is a shallow trench isolation (STI) region prepared in trenches formed in the substrate. Other types of isolation regions may also be useful. The isolation regions are provided to separate columns of memory cells in the bitline direction and adjacent drain regions of select transistors of memory cells in the wordline direction.

In one embodiment, the lower ILD layer is formed of silicon oxide. The cell dielectric layer, for example, may be formed by Chemical Vapor Deposition (CVD). Other techniques may also be useful. A planarizing process may be performed. The planarizing process, for example, may include chemical mechanical polishing (CMP). Other types of planarizing process may also be useful.

In one embodiment, a dielectric liner 261 may be formed over the cell dielectric layer. The dielectric liner, for example, may serve as an etch stop layer. In one embodiment, the dielectric liner is formed of a low k dielectric. For example, the dielectric liner may be an nBLOK layer. Other types of dielectric liner materials may also be useful. The dielectric liner, for example, may be formed by blanket deposition using CVD. Other techniques of forming the dielectric liner may also be useful.

A lower stack dielectric layer 267L is formed on the dielectric liner. The lower bit stack dielectric layer, for example, may be formed of a same material as the cell dielectric layer. In one embodiment, the lower bit stack dielectric layer is formed of silicon oxide. Other types of dielectric materials may also be useful for the dielectric layer. The lower bit stack dielectric layer, for example, may be formed CVD. Other techniques may also be useful.

In one embodiment, the process continues to form a cell stack. A bottom cell stack layer 242 is formed on the substrate. The bottom cell stack layer, for example, covers the lower bit stack dielectric layer. The bottom cell stack layer may be formed by physical vapor deposition (PVD). Forming the bottom cell stack layer using other techniques, such as CVD, may also be useful.

A first mask layer 212 is formed on the substrate. The mask layer, for example, is formed over the bottom cell stack layer. In one embodiment, the mask layer is a soft mask layer, such as a photoresist layer. An exposure source may selectively expose the photoresist layer through a reticle containing the desired pattern. For example, a first reticle or mask is used. After selectively exposing the photoresist layer, it is developed to form openings corresponding to location where the bottom cell stack layer is to be removed. To improve lithographic resolution, an anti-reflective coating (not shown) may be used below the photoresist layer. In other embodiments, the mask layer may be a hard mask layer. For example, the hard mask layer may be TEOS layer. Patterning the hard mask layer may be achieved using a soft mask layer, such as photoresist.

The patterned mask layer is used to pattern the bottom cell stack layer. In one embodiment, an anisotropic etch, such as reactive ion etch (RIE), is used to remove exposed portions of the bottom cell stack layer. Other types of etch processes may also be useful. The etch transfers the pattern of the mask layer to the underlying bottom cell stack layer. After the patterning of the bottom cell stack layer, the mask layer is removed. In one embodiment, the mask layer is removed by ashing. Other techniques of removing the mask layer may also be useful. For example, in the case of a hard mask, a wet etch may be employed to remove the mask. Etching of the exposed bottom cell stack layer creates a topography. For example, the patterning of the resistive layer creates a stepped topography, with the remaining bottom cell stack layer forming a step with recesses on the sides thereof above the lower bit stack dielectric layer.

As shown, the process is up to the patterning of the bottom cell stack layer of the cell stack. For example, the process includes forming the lower ILD layer on the substrate, dielectric liner, and lower bit stack dielectric layer, followed by formation and patterning of the bottom cell stack layer of the cell stack.

Figure 3B:
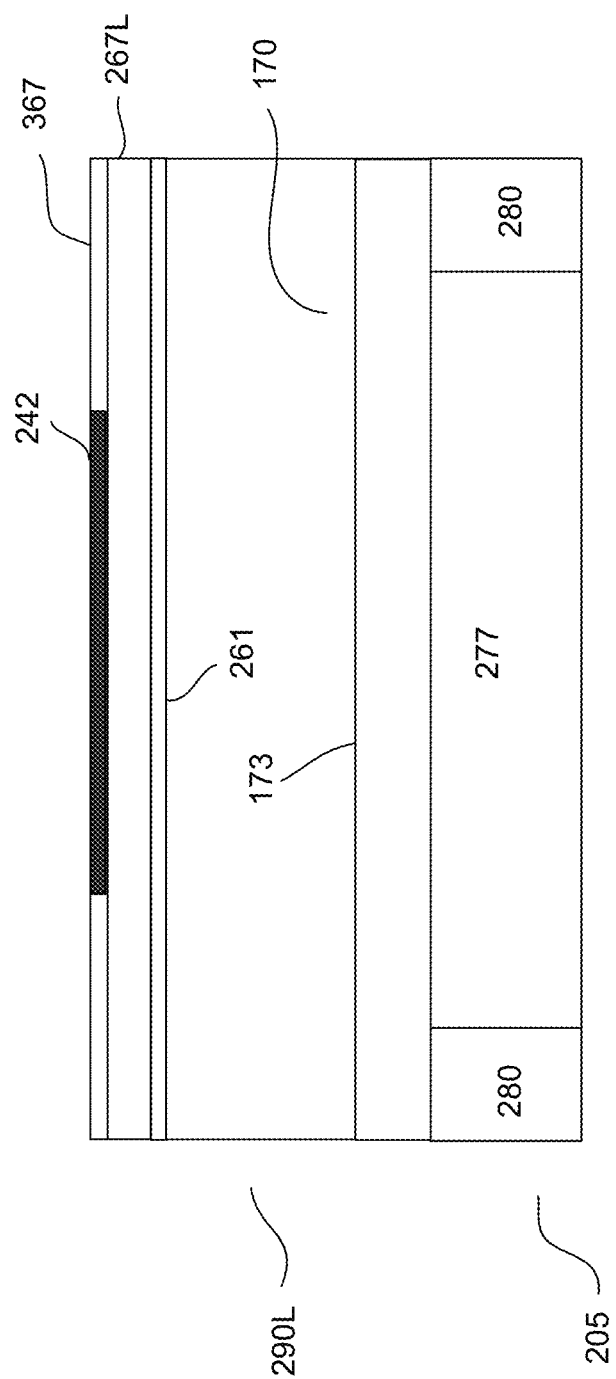

Referring to FIG. 3b, a dielectric layer 367 is formed on the substrate, filling the recesses as well as covering the patterned bottom cell stack layer of the cell stack. The dielectric layer, for example is silicon oxide. Other types of dielectric materials may also be useful. In one embodiment, dielectric layer may be the same as the lower bit stack dielectric layer. The dielectric layer, for example, may be formed by CVD. Other techniques for forming the dielectric layer may also be useful. Excess dielectric material may be removed by a planarizing process. The planarizing process, for example, may be CMP. Other types of planarizing process may also be useful. The planarizing forms a planar surface over the substrate. For example, the top surfaces of the bottom cell stack layer and the dielectric layer are co-planar.

Figure 3C:
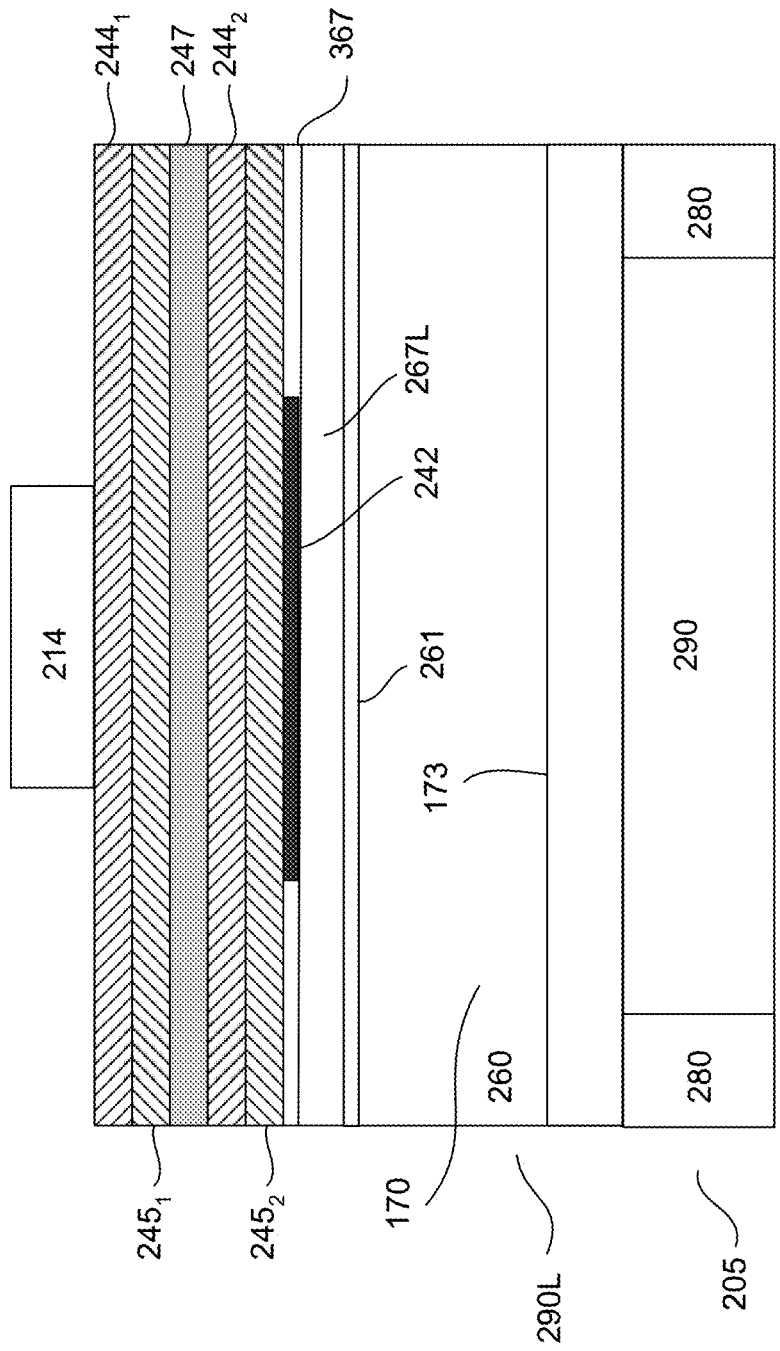

Referring to FIG. 3c, various layers of a secondary selector stack 150 are formed on the substrate. In one embodiment, the secondary selector layers of the secondary selector stack are sequentially formed on the substrate. For example, second lower diode layer $245_2$, second upper diode layer $244_2$, connection layer 247, first lower diode layer $245_1$ and first upper diode layer $244_1$ are sequentially formed on the substrate. In one embodiment, the diode layers are polysilicon. Other types of semiconductor materials may also be useful. The layers, for example, may be formed by CVD. Forming the diode layers using other techniques may also be useful. For example, the diode layers may be formed by atomic layer deposition (ALD) techniques.

In one embodiment, the diode layers of a same diode are oppositely doped. For example, one of the diode layers is doped with a first type dopant while the other is doped with a second type dopant. For example, the upper diode layers may be p-type doped layers and the lower diode layers may be n-type doped. Providing the n-type doped upper diode layers and p-type doped lower diode layers may also be useful. The type of dopants and dopant concentration may be appropriately selected based on the design requirements. The layer may be in situ doped during formation or doped by ion implantation after the formation of each layers.

In one embodiment, the connection layer 247 is formed of an ECM. For example, the connection layer is formed of an ECM with high conductivity. In one embodiment, the connection layer is titanium nitride (TiN). Other types of ECMs may also be useful. In one embodiment, the connection layer may be formed by CVD. Other techniques for forming the connection layer are also useful.

A second mask layer 214 is formed on the substrate. The mask layer, for example, is formed over the first upper diode layer. In one embodiment, the mask layer is a soft mask layer, such as a photoresist layer. An exposure source may selectively expose the photoresist layer through a reticle containing the desired pattern. For example, a second reticle is used to form the second mask. After selectively exposing the photoresist layer, it is developed to form openings corresponding to location where the secondary selector layers are to be removed. To improve lithographic resolution, an anti-reflective coating (not shown) may be used below the photoresist layer. In one embodiment, the patterned mask layer may be a patterned hard mask layer.

Figure 3D:
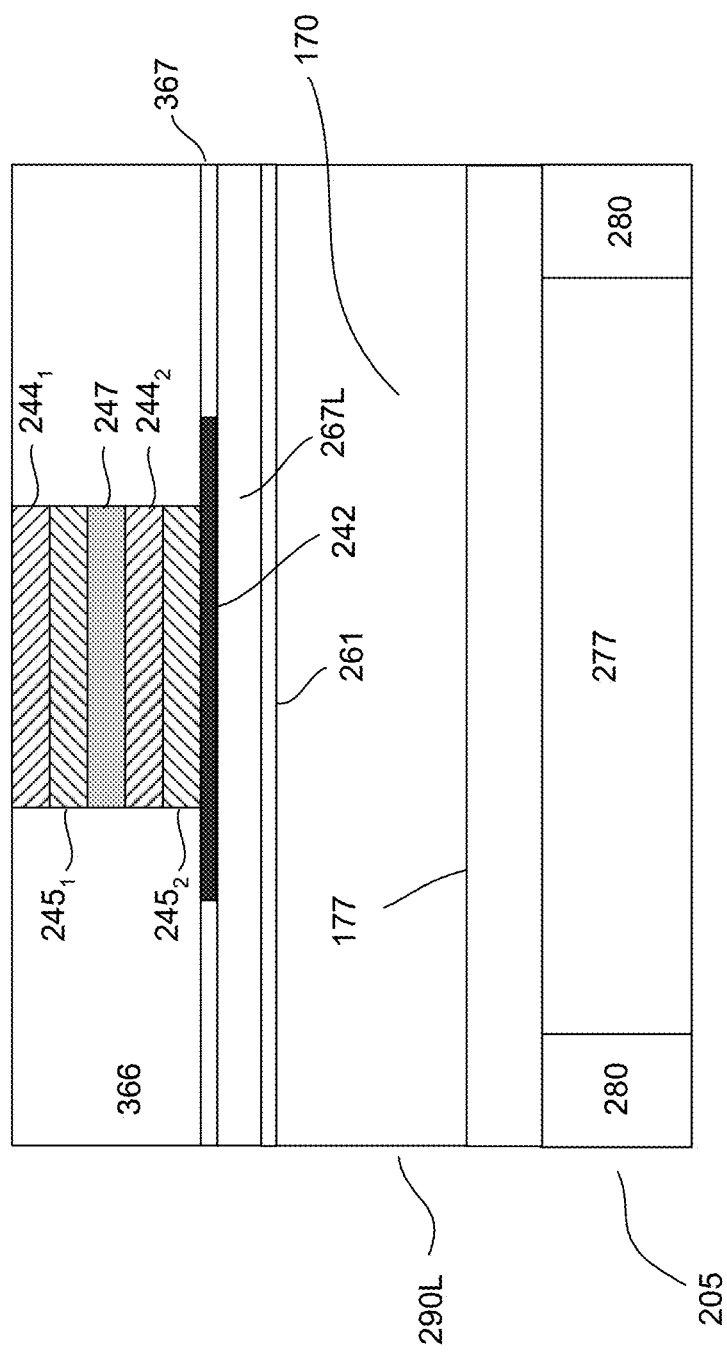

The patterned mask layer is used to pattern the secondary selector layers. The patterned mask layer defines the area of the secondary selector stack. In one embodiment, an anisotropic etch, such as RIE, is used to remove exposed portions of the secondary selector layers to form the secondary selector stack. Other types of etch processes may also be useful. The etch transfers the pattern of the mask layer to the underlying bit selector layers, forming the secondary selector stack, as shown in FIG. 3d. After the patterning the secondary selector layers, the mask layer is removed. In one embodiment, the mask layer is removed by ashing. Other techniques of removing the mask layer may also be useful. Etching of the secondary selector layers creates recesses or gaps above the top surface of the bottom cell stack and dielectric layers.

A dielectric layer 366 is formed on the substrate, filling the recesses as well as covering the secondary selector stack. The dielectric layer, for example is silicon oxide. Other types of dielectric materials may also be useful. In one embodiment, the dielectric layer may be the same as the lower bit stack dielectric layer. The dielectric layer, for example, may be formed by CVD. Other techniques for forming the dielectric layer may also be useful. Excess dielectric material may be removed by a planarizing process. The planarizing process, for example, may be CMP. Other types of planarizing process may also be useful. The planarizing forms a planar surface over the substrate. For example, the top surfaces of the secondary selector stack and the dielectric layer are co-planar. For example, the dielectric layer serves as the stack dielectric layer.

Figure 3E:
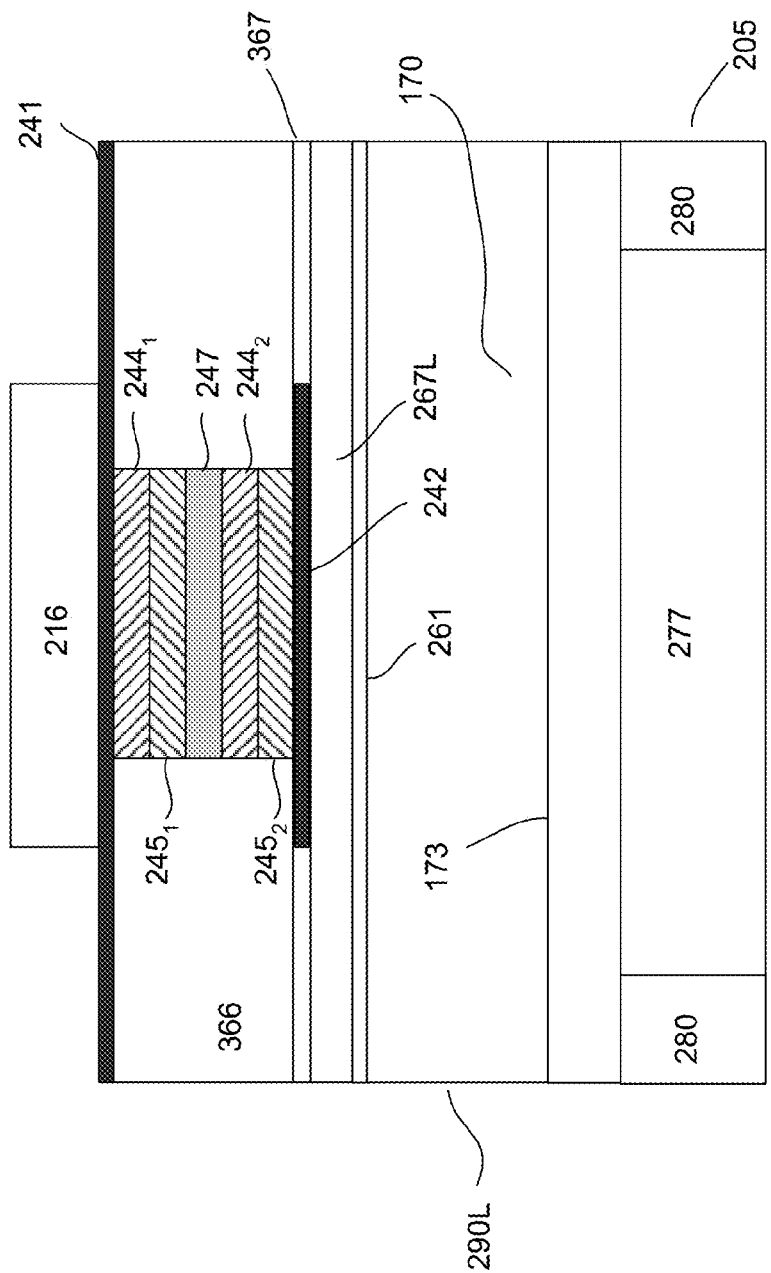

A top cell stack layer 241 is formed on the substrate, as shown in FIG. 3e. In one embodiment, the top cell stack layer is formed of a same material as the bottom cell stack layer. The top cell stack layer, for example, is formed by CVD. Other processes, such as sputtering or ebeam, may also be useful.

As discussed, the top and bottom cell stack layers may include capping or protective layers between the secondary selector stack. For example, one or more capping layers are provided on the top surface of the bottom cell stack layer and on the bottom surface of the top cell stack layer. The capping layers may be employed to reduce oxidation or poor interface viscosity between layers. Providing capping layers on both top and bottom sides of the top and bottom cell stack layers may also be useful.

A third mask layer 216 is formed on the substrate. The mask layer, for example, is formed over the top cell stack layer. In one embodiment, the mask layer is a soft mask layer, such as a photoresist layer. The third mask layer is used to pattern the top cell stack layer. The third mask layer is patterned using a third reticle. In one embodiment, the third reticle is the first reticle. For example, the first reticle may be re-used to pattern the third mask layer. To improve lithographic resolution, an anti-reflective coating (not shown) may be used below the photoresist layer. In other embodiments, the patterned mask layer may be a patterned hard mask layer.

In one embodiment, an anisotropic etch, such as RIE is used to remove exposed portions of the top cell stack layer unprotected by the third mask layer. Other types of etch processes may also be useful. The etch transfers the pattern of the mask layer to the underlying top cell stack layer. After the patterning of the top cell stack layer, the mask layer is removed. In one embodiment, the mask layer is removed by ashing. Other techniques of removing the mask layer may also be useful. As previously discussed, the top and bottom cell stack layers protrude beyond the secondary selector stack on first sides and the secondary selector stack protrudes beyond the top and bottom cell stack layers on second sides. Etching of the exposed top cell stack layer creates a topography. For example, the patterning of the top cell stack layer creates a stepped topography, with the remaining top cell stack layer forming a step with recesses on the sides thereof above the stack dielectric layer.

Figure 3F:
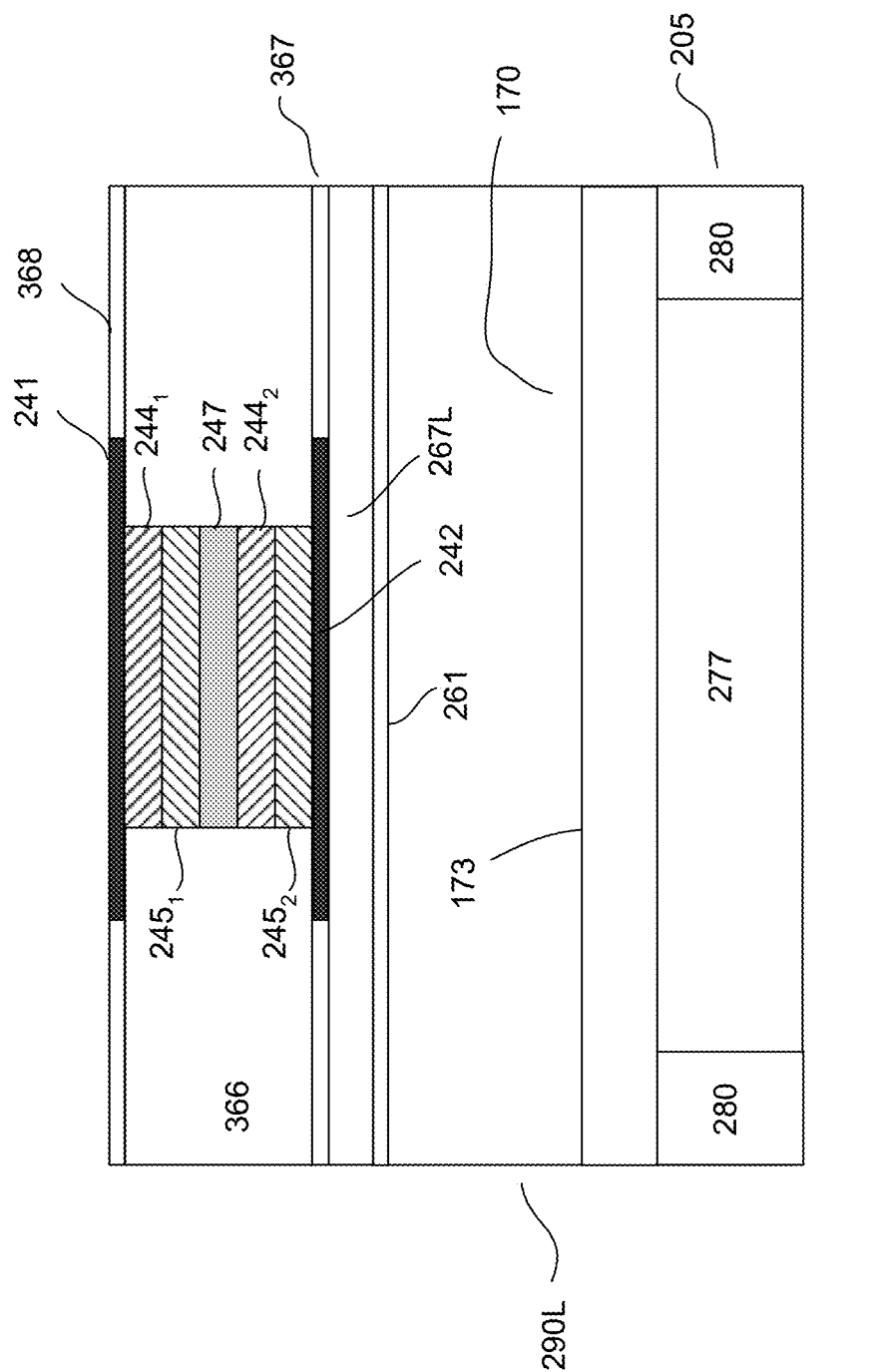

Referring to FIG. 3f, a dielectric layer 368 is formed on the substrate, filling the recesses as well as covering the patterned top cell stack layer. The dielectric layer, for example is silicon oxide. Other types of dielectric materials may also be useful. In one embodiment, the dielectric layer may be the same as the stack dielectric layer. The dielectric layer, for example, may be formed by CVD. Other techniques for forming the dielectric layer may also be useful. Excess dielectric material may be removed by a planarizing process. The planarizing process, for example, may be CMP. Other types of planarizing process may also be useful. The planarizing forms a planar surface over the substrate. For example, the top surfaces of the top cell stack layer and the dielectric layer are co-planar.

Figure 3G:
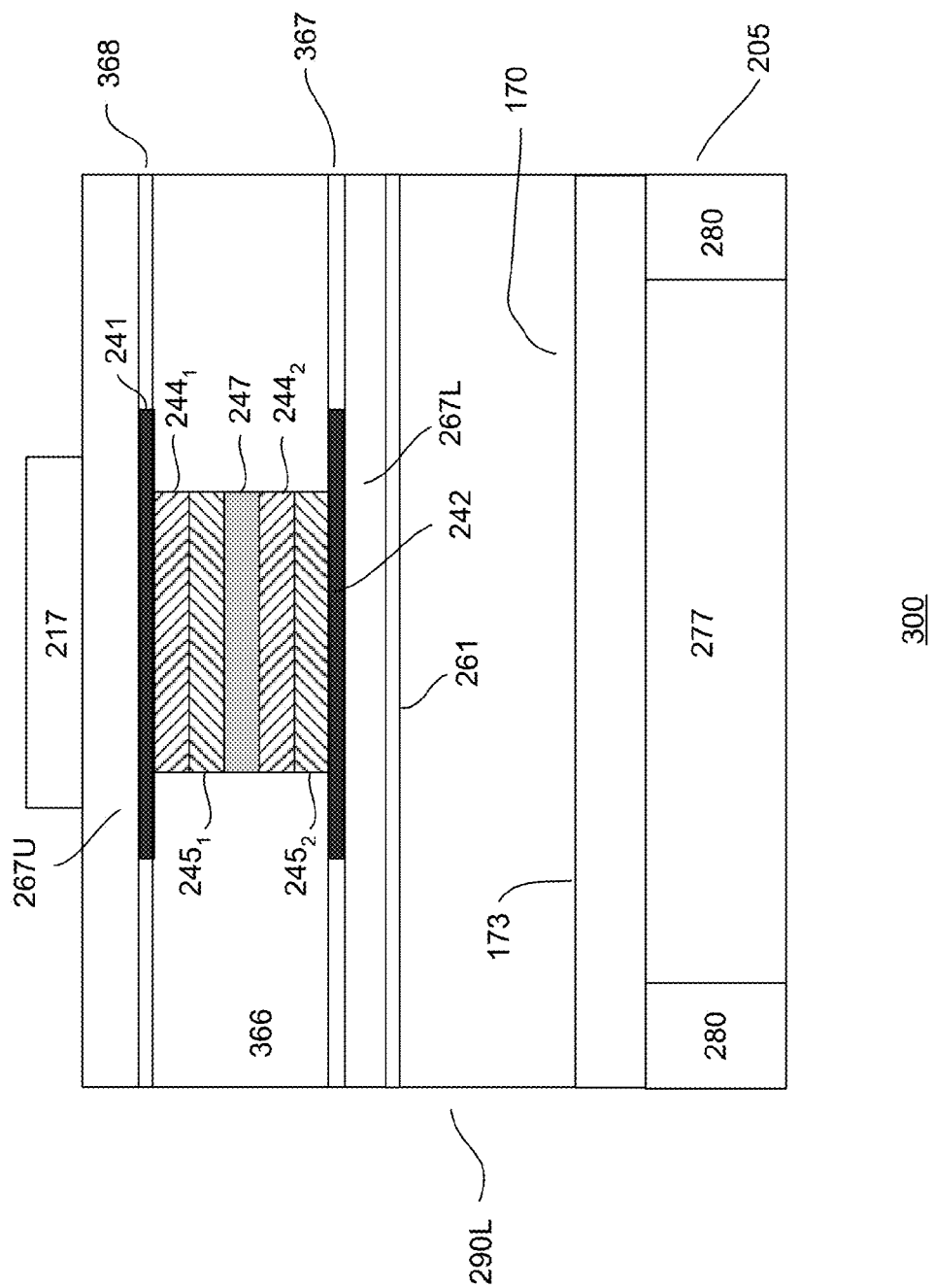

Referring to FIG. 3g, an upper bit stack dielectric layer 267U is formed on the substrate, covering the top cell stack and dielectric layers. In one embodiment, the upper bit stack dielectric layer is formed of a dielectric material. The dielectric material may be the same material as the stack dielectric layer. For example, the dielectric material is silicon oxide. The upper bit stack dielectric layer may be formed by, for example, CVD. Other techniques of forming the upper bit stack dielectric layer may also be useful.

A fourth mask layer 217 is formed on the substrate. The mask layer, for example, is formed over the upper bit stack dielectric layer. In one embodiment, the mask layer is a soft mask layer, such as a photoresist layer. The mask layer is patterned by exposing the photoresist with an exposure source using a fourth reticle. After development, the pattern of the reticle is transferred to the fourth mask layer. To improve lithographic resolution, an anti-reflective coating (not shown) may be used below the photoresist layer. Providing a hard mask layer, such as a TEOS mask layer, may also be useful. The mask layer is used to define the cell stack. In one embodiment, the cell stack may be rectangular in shape with a footprint which includes the secondary selector stack and top and bottom cell stack layers. Other configurations of the cell stack may also be useful.

Figure 3H:
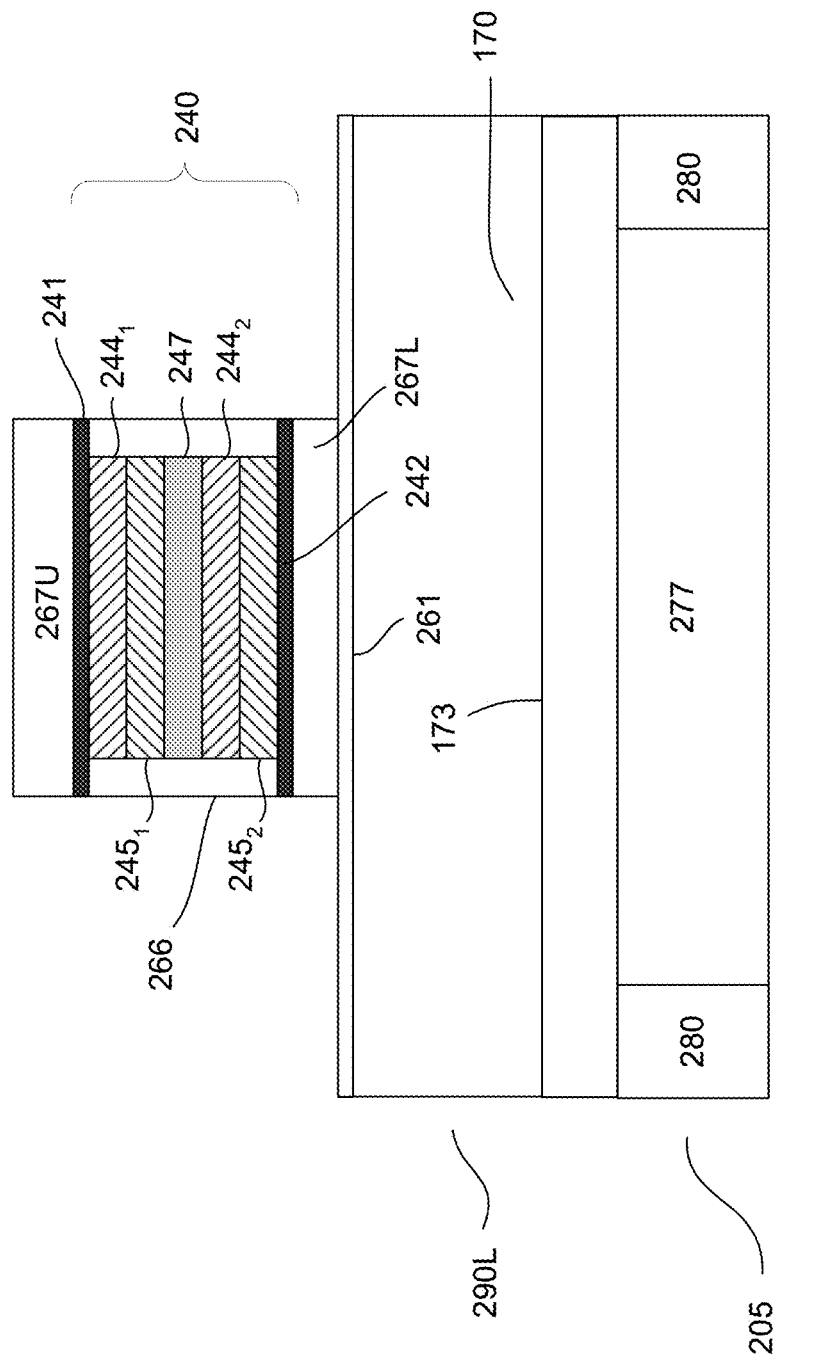

In one embodiment, an anisotropic etch, such as RIE is performed using the fourth mask layer, as shown in FIG. 3h. The etch removes exposed portions of the layers up to the dielectric liner. The dielectric liner, for example, serves as an etch stop. Other types of etch processes may also be useful. The etch transfers the pattern of the mask layer to the underlying layers, forming the cell stack 240. The cell stack, for example, includes the upper bit stack dielectric layer. After forming the cell stack, the mask layer is removed. In one embodiment, the mask layer is removed by ashing. Other techniques of removing the mask layer may also be useful. Etching of the layers forms recesses above the top surface of the dielectric liner.

Figure 3J:
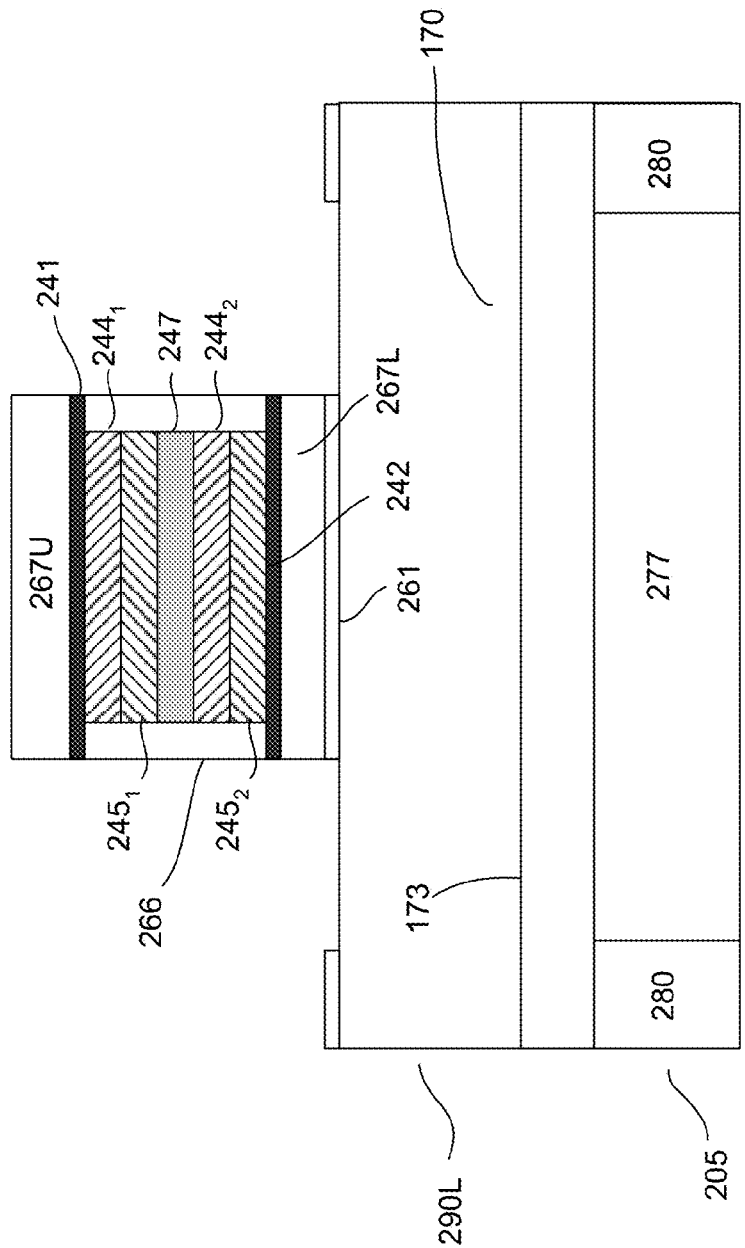
Figure 3K:
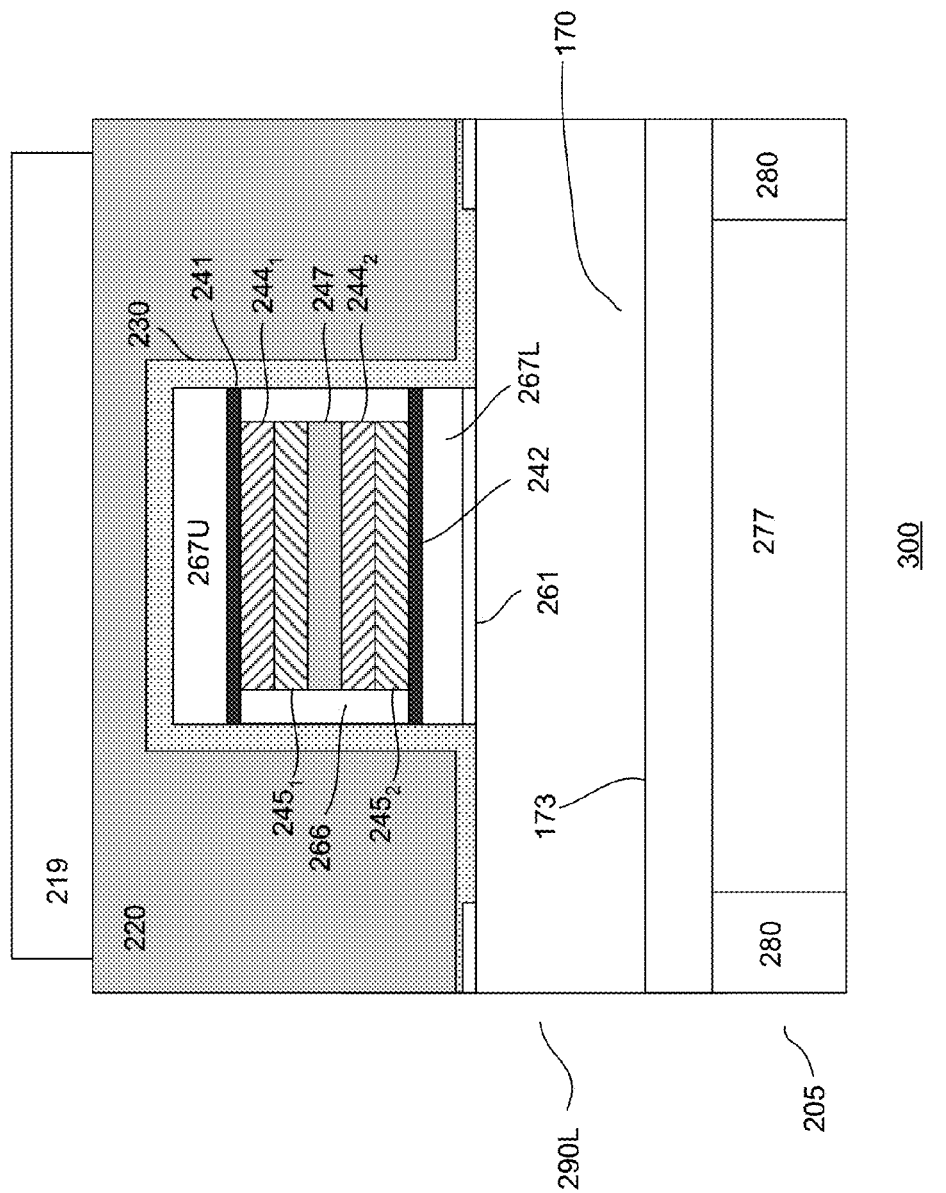
Figure 3I:
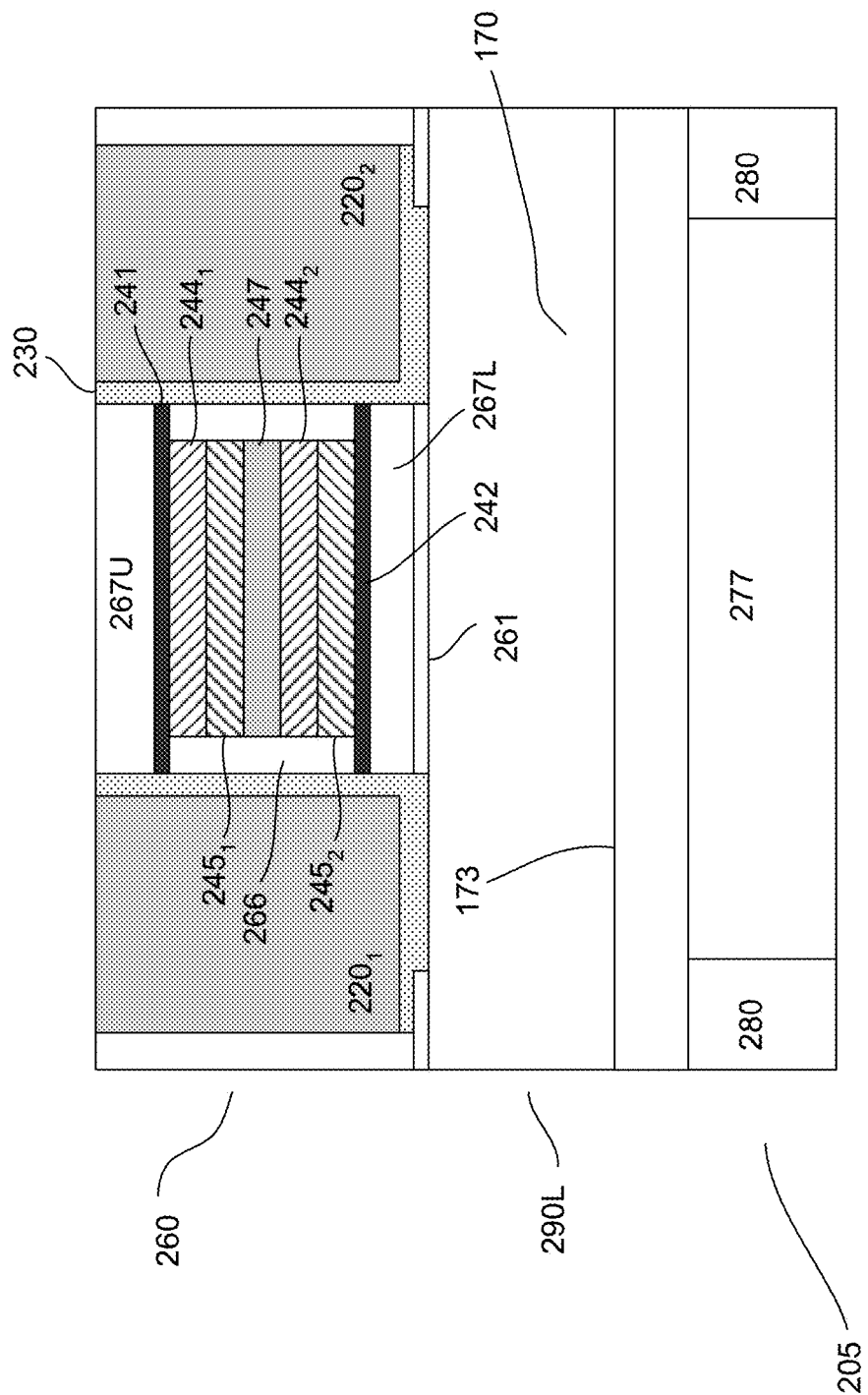

A fifth mask layer 218 is formed on the substrate, as shown in FIG. 3i. The mask layer, for example, is formed over the dielectric liner. In one embodiment, the mask layer is a soft mask layer, such as a photoresist layer. The mask layer is patterned by exposing the photoresist with an exposure source using a fifth reticle. After development, the pattern of the reticle is transferred to the mask layer. To improve lithographic resolution, an anti-reflective coating (not shown) may be used below the photoresist layer. The mask layer is used to open the dielectric liner. For example, the mask layer contains an opening corresponding to at least the drain connector. As shown, the mask may include an opening which surrounds the cell stack to include locations of the connection units and drain connector. Other configurations of the mask may also be useful. However, it is understood that it is not necessary to expose the dielectric liner where the connection units are located since no connection to the metal level below is needed.

Referring to FIG. 3j, an etch is performed to remove exposed portions of the dielectric liner. For example, the etch removes the dielectric liner to expose at least the drain connector. The etch, for example, is an anisotropic etch such as RIE. Other types of etch processes may also be useful. After patterning the dielectric liner, the mask layer is removed. In one embodiment, the mask layer is removed, for example, by ashing. Other techniques of removing the mask layer may also be useful.

A thin insulator layer may be formed over the substrate surface (not shown). The thin insulator layer, for example, is silicon oxide. Other types of insulating or dielectric materials may also be useful. The insulator may be formed by, for example, CVD. Other techniques for forming the insulator layer may also be useful. The thin insulator layer, for example, may be employed to initialize the resistive elements of the memory cell. For example, the insulator layer may be employed to initialize the resistive element using high breakdown voltage. The insulator layer may be less than about 10 nm thick. For example, the insulator layer may be about 1-5 nm thick. Other thicknesses may also be useful.

Referring to FIG. 3k, the process continues to form the connection units and cell connector. In one embodiment, a connector liner 230 is formed on the substrate. The connector liner lines the cell stack, dielectric liner and portion or portions exposed by the patterned dielectric liner. The connector liner may be a liner stack, having a plurality of liner layers. The various layers, for example, may be formed by PVD, CVD, other forming techniques or a combination of forming techniques.

An ECM layer is formed over the substrate, filling the spaces between the recesses surrounding the cell stack and covering the connector liner. The ECM layer, for example, is an ECM with high conductivity. For example, the ECM layer may be TiN. Other types of ECMs with high conductivity may also be useful. The ECM layer, for example, serves to form the bulk connector of the connection units. The ECM layer, for example, is formed by CVD. Other techniques of forming the ECM layer may also be useful.

A sixth mask layer 219 is formed on the substrate, as shown in FIG. 3k. The mask layer, for example, is formed over the ECM layer. In one embodiment, the mask layer is a soft mask layer, such as a photoresist layer. The mask layer is patterned by, for example, exposing the photoresist with an exposure source using a sixth reticle. After development, the pattern of the reticle is transferred to the mask layer. To improve lithographic resolution, an anti-reflective coating (not shown) may be used below the photoresist layer. Alternatively, the patterned mask layer may be a patterned hard mask layer.

The mask layer is used to pattern the connector liner and ECM layer. For example, an anisotropic etch, such as RIE, is performed to pattern the connector liner and ECM layer using the mask layer. After patterning the layers, connection units $220_1$ and $220_2$ and the cell connector are defined. The mask layer is removed by, for example, ashing. Other techniques for removing the mask layer may also be useful.

In one embodiment, the BL connection units may include a neck portion which is narrower than the main portion. The neck portion of the BL connection units contacts the top and bottom cell stack layers. Providing a neck portion advantageously reduces the cross-sectional area of the interface between the BL connection units and cell stack layers.

As shown in FIG. 3l, a dielectric layer 260 is deposited on the substrate after removing the mask layer. The dielectric layer fills the gaps and covers the connection units, cell connector and cell stack. The dielectric layer, for example, serves as the cell dielectric layer. In one embodiment, the dielectric layer is silicon oxide. For example, the dielectric layer may be the same as the ILD layer. Other types of dielectric layers may also be useful. Various techniques may be used to form the cell dielectric layer. For example, the cell dielectric layer may be formed by CVD. Excess dielectric material may be removed by a planarizing process. The planarizing process, for example, may be CMP. Other types of planarizing process may also be useful. The planarizing forms a planar surface over the substrate. In one embodiment, the planarizing process removes the liner layer over the cell stack. For example, the top surfaces of the cell stack, connection units and cell connector are co-planar.

Figure 3M:
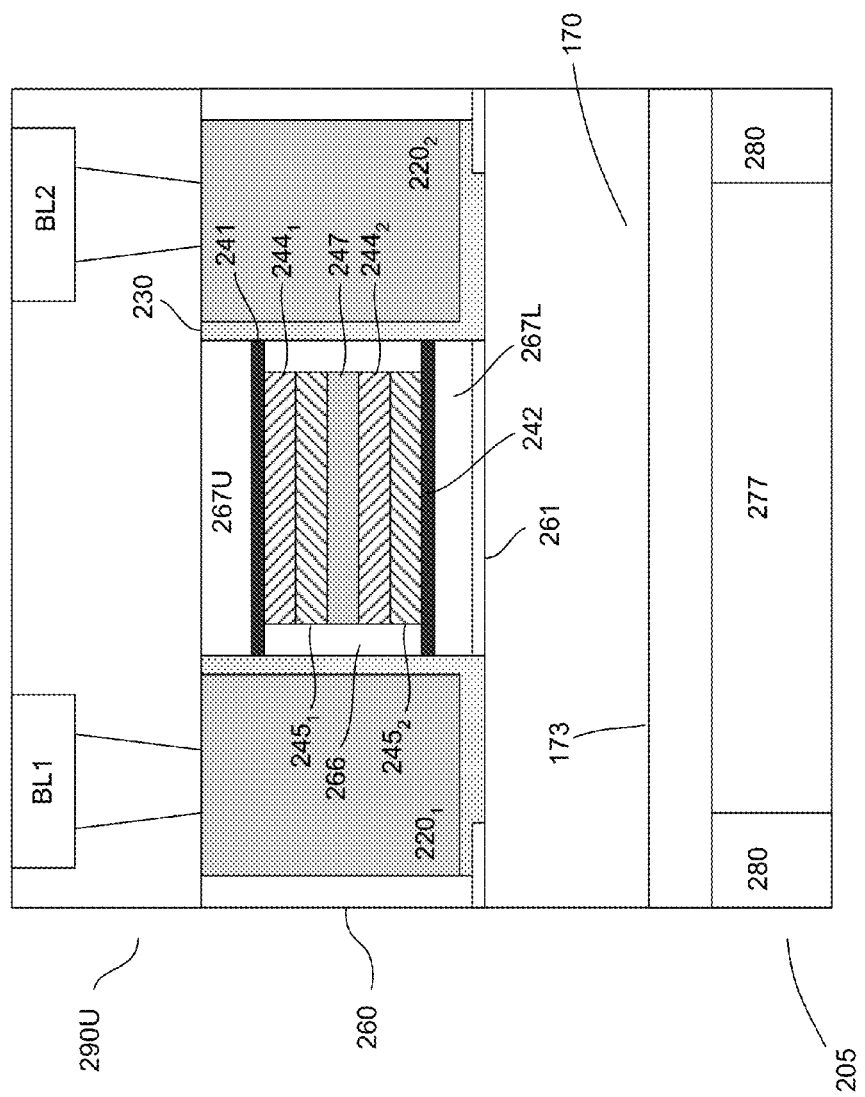

Referring to FIG. 3m, an upper ILD layer 290U is formed over the cell dielectric layer. The upper ILD layer may be silicon oxide. Other types of dielectric layers may also be useful. Various techniques may be used to form the upper ILD layer. For example, the upper ILD layer may be formed by CVD. First and second bitlines BL1 and BL2 are formed in the metal level of the upper ILD layer. BL1 and BL2 are coupled to first and second connection units by first and second bitline contacts in the upper contact level. The bitlines and contacts may be formed of copper or copper alloy. Other types of conductive materials may also be useful. The bitlines and contacts may be formed by dual damascene techniques. Other techniques for forming the bitlines and contacts may also be useful. The process continues to complete forming the device. The process may include, for example, forming additional metal levels, final passivation, dicing, packaging and testing. Other processes may also be included.

As discussed, one embodiment of the memory cell is a PCRAM cell. In the case of a PCRAM cell, the top and bottom cell stack layers are resistive layers. The resistive layers, in one embodiment, are PCM layers. The PCM layers, for example, may be formed of chalcogenide material. In one embodiment, the chalcogenide material is a germanium-antimony-tellurium (GeSbTe) alloy. In one embodiment, the chalcogenide material is $Ge_2Sb_2Te_5$ (GST). Other types of chalcogenide or PCMs may also be employed.

The PCM layers may include one or more capping or protective layers on top and/or bottom surfaces. The protective layers reduce oxidation and/or provide good interface forming. The protective layer, for example, may be silicon nitride or oxynitride. Other types of protective layers may also be useful.

In some embodiments, to further increase programming efficiency, the PCM layers may be doped with insulating islands. For example, the PCM layers may be doped with silicon oxide or other insulating materials. The presence of the insulating islands in the PCM layers effectively lowers the contact area between the PCM layers and liner, making current crowding effect more obvious. As a result, a lower programming (heating) current is needed for achieving melting and crystallization temperatures. Reduced programming current facilitates the use of smaller transistors, thereby reducing cell size. Alternatively, the PCM layers may be doped with heating islands, such as an ECM with high conductivity. For example, the ECM may be TiN. The heating islands act as heaters within the PCM layers and to reduce the heat loss during the heating of the PCM layers contacting the BL connection units, therefore improving heating efficiency. The insulating or heating islands may be incorporated into the PCM layers by, for example, in situ doping. Other techniques for incorporating the insulating or heating islands, such as by ion implantation, may also be useful. The islands may be about 10-20 mole percent of the PCM layers. Other mole percentages may also be useful.

As for the liner of a connection unit, it serves as a programmer. A programmer is employed to program the PCM layers. For example, the programmer is used to SET and RESET the PCM layers. The programmer also facilitates read accesses. The programmer, for example, is a heater which is used to SET and RESET the PCM layers.

In one embodiment, the liner is a liner stack, having multiple liner layers. For example, the liner stack may be a 2 or 3 layered stack. Providing the liner stack having other number of layers may also be useful. The liner stack may be formed of ECMs. The liner stack may be configured to be in direct contact with the PCM or disposed between an ECM with high conductivity. For example, the liner may be a 2 layered stack, such as TiN/TaN, with TaN in direct contact with the PCM or a 3 layered stack, such as TiN/TaN/TiN, with TiN in direct contact with the PCM. Other configurations of the liner may also be useful.

In other embodiments, the top and bottom cell stack layers may serve as electrode layers for one electrode of the resistive elements R1, R2, R3 and R4. For example, in the case of a 2-terminal based RAM cell which uses a resistor's changeable resistance to represent a "0" or a "1", such as a ReRAM or a STT-RAM, the top and bottom cell stack layer serve as electrode layers for an electrode of the resistive elements. As for the liner layer, it includes one or more layers used for the storage elements. Additionally, it may also be an electrode layer between the bulk connector and the storage layers, serving as another electrode of the resistive elements.

In the case of a ReRAM cell, the top and bottom cell stack layers serve as electrodes. The electrode layers, for example, are formed of platinum (Pt) or iridium (Ir). Other types of electrode layers may also be useful. As for the liner, it includes a resistive layer which can form filaments, such as a non-stoichiometric metal oxide. For example, the resistive may be $Ta_2O_{5-x}$ or $TaO_x$, where x is not an integer. Other types of resistive materials which can form filaments may also be useful. The liner also includes an electrode layer, such as Pt or Ir, forming the liner stack. The electrode layer of the liner stack contacts the bulk connector while the resistive layer contacts the electrode layers of the cell stack.

In the case of a STT-RAM cell, the cell stack layer, similar to ReRAM, serves as an electrode. For example, the cell stack layer is formed of PtMn, IrMn or Co/Pd. Other types of electrode layers may also be useful. As for the liner, it includes a MRM stack. The MRM stack includes first and second MRM layers separated by an insulating or tunneling layer layer. The first MRM layer, for example, is a fixed or pinned layer having a fixed magnetization polarity or direction while the second MRM layer is a free layer with a switchable magnetization polarity or direction. In one embodiment, the pinned layer is CoFeB, the insulating layer is MgO and the free layer is a stack which includes CoFeB/Ru/CoFeB. Other configurations of MRM stack may also be useful. The first or second MRM layer may be configured to contact the ends of the cell stack layer. An electrode layer may be disposed between the MRM layer and bulk connector.

With respect to the embodiment described in FIG. 2j, the process is similar to that described in FIGS. 3a-m. The difference is that after patterning the cell stack layer, a cell stack connector layer is deposited and planarized to form a planar surface with the cell stack layer. The cell stack connector layer, for example, is an ECM layer, such as TiN. The cell stack connector layer, for example, serves as a heater layer. The cell stack connector layer may be formed by, for example, CVD. The planarizing process may be, for example, CMP. These process steps are performed after forming the top and bottom cell stack layers. In one embodiment, thin insulator layer may be formed on the side of the liner of the BL connection units adjacent to the first side of the cell stack. As such, the insulator layer is in contact with the cell stack connectors. The thin insulator layer is formed after the patterning of the dielectric liner as shown in FIG. 3j. The insulator layer, for example, may be silicon oxide. The thin insulator layer may serve as a high voltage breakdown layer for initializing the memory cell. Other parts of the process are similar to that of FIGS. 3a-m.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
   a storage unit, the storage unit
      having a plurality of resistive elements which form a plurality of bits of the memory cell, wherein the plurality of bits are coupled to respective bitlines of a memory array which form columns of a memory array, and
      a secondary selector of the storage unit, the secondary selector is coupled to the plurality of bits of the storage unit of the memory cell;
   a primary selector coupled to the storage unit, the primary selector is coupled to a wordline of the memory cell which is coupled to a plurality of memory cells to form a row of memory cells of the memory array; and
   wherein, when the memory cell is selected for access by activating the wordline of the memory array which the memory cell is coupled to, the secondary selector of the memory cell selects one bit of the plurality of bits to access based on signals on the respective bitlines.

2. The memory cell of claim 1 wherein:
   the storage unit comprises first, second, third and fourth resistive elements; and
   the respective bitlines comprises first and second bitlines coupled to the storage unit.

3. The memory cell of claim 2 wherein:
   the first, second, third and fourth resistive elements R1, R2, R3 and R4 are coupled to form a resistive loop of the storage unit; and the secondary selector is coupled to the resistive loop to select first and second resistive elements or third and fourth resistive elements to access.

4. The memory cell of claim 3 wherein:
each resistive element has first and second resistive terminals;
first resistive terminals of adjacent resistive elements are commonly coupled and second resistive terminals of adjacent resistive elements are commonly coupled to form the resistive loop; and
wherein
a first node N1 is formed by first resistive terminals of R1 and R2,
a second node N2 is formed by second resistive terminals of R2 and R4,
a third node N3 is formed by first resistive terminals of R3 and R4,
a fourth node N4 is formed by second resistive terminals of R1 and R3, and
the secondary selector is coupled to N1 and N3.

5. The memory cell of claim 4 wherein:
the secondary selector comprises first and second secondary selectors, the first secondary selector is coupled to N1 and the second secondary selector is coupled to N3;
common terminals of the first and second secondary selectors form node N5; and
the primary selector is coupled to N5.

6. The memory cell of claim 5 wherein the first bitline is coupled to N4 and the second bitline is coupled to N2.

7. The memory cell of claim 6 wherein the memory cell is configured as a dual port dual-bit memory cell, wherein the first port is the first bitline and the second port is the second bitline.

8. The memory cell of claim 6 wherein the memory cell is configured as a single port quad-bit memory cell, wherein the resistive elements represent a bit of the memory cell.

9. The memory cell of claim 5 wherein:
the secondary selector comprises first and second diodes coupled in series; and
wherein
a first anode terminal of the first diode is coupled to N1,
a first cathode terminal of the first diode is coupled to a second anode terminal of the second diode which forms the common terminal of the secondary selector and is N5, N5 is coupled to the primary selector, and
the second anode terminal of the second diode is coupled to N3.

10. The memory cell of claim 1 comprises a PCRAM memory cell.

11. The memory cell of claim 1 comprises a ReRAM or STT-RAM memory cell.

12. A method of forming a memory cell comprising:
providing a substrate;
forming a cell stack, the cell stack includes a bit selector stack disposed between top and bottom cell stack layers, wherein the top and bottom cell stack layers are resistive layers that form resistive elements which form a plurality of bits of the memory cell, wherein the plurality of bits are coupled to respective bitlines of a memory array which form columns of a memory array, and wherein the bit selector stack includes
a primary selector coupled to the cell stack and to a wordline of the memory cell which is coupled to a plurality of memory cells to form a row of memory cells of the memory array, and a secondary selector coupled to the plurality of bits of the memory cell, the secondary selector having first and second secondary selectors, and
a selector connection layer separating the first and secondary selectors; and
forming first and second bitline (BL) connection units corresponding to the respective bitlines at opposing first sides of the cell stack, the BL connection units are coupled to the top and bottom cell stack layers without contacting the bit selector stack, wherein, when the memory cell is selected for access by activating the wordline of the memory array which the memory cell is coupled to, the secondary selector of the memory cell selects one bit of the plurality of bits based on signals on the respective bitlines.

13. The method of claim 12 wherein the memory cell comprises first, second, third and fourth resistive elements disposed at the interfaces of the top and bottom cell stack layers and the first and second BL connection units.

14. The method of claim 12 wherein the top and bottom cell stack layer comprises a phase change material to form a phase change random access memory (PCRAM) cell.

15. The method of claim 14 wherein the BL connection units comprise an insulator layer in contact with the top and bottom cell stack layer for initializing breakdown of the memory cell.

16. The method of claim 14 wherein the BL connection units comprise a bulk connector and a connector liner, wherein the connector liner lines at least a side of BL connection units contacting the cell stack layers.

17. The method of claim 16 wherein:
the bulk connector comprises an electrical connection material (ECM) with high conductivity; and
the connector liner comprises a connector liner stack having a first ECM layer with bad thermal conductivity and a second ECM layer with high thermal conductivity, wherein the second ECM layer contacts the top and bottom cell stack layers.

18. The method of claim 14 wherein the top and bottom cell stack layers are doped with insulating islands or heating islands.

19. The method of claim 16 wherein:
the top and bottom cell stack layers comprise cell stack connectors which contact the connector liner of the BL connection units, wherein the cell stack connectors comprise ECM with high thermal conductivity to serve as heating elements; and
the connector liner of the BL connection units comprises ECM with bad thermal conductivity to serve as a heat shield.

20. A method of forming a memory cell comprising:
providing a substrate with a lower metal level;
forming a cell stack above the lower metal level, the cell stack includes a bit selector stack disposed between top and bottom cell stack layers, wherein the top and bottom cell stack layers are resistive layers that form resistive elements which form a plurality of bits of the memory cell, wherein the plurality of bits are coupled to respective bitlines of a memory array which form columns of a memory array, the top and bottom stack layers comprise a phase change material, wherein the bit selector stack includes
a primary selector coupled to the cell stack and to a wordline of the memory cell which is coupled to a plurality of memory cells to form a row of memory cells of the memory array, and a secondary selector coupled to the plurality of bits of the memory cell, the secondary selector having first and second secondary selectors, and a selector connection layer separating the first and second secondary selectors; and forming first and second bitline (BL) connection units corresponding to the respective bitlines at opposing first sides of the cell stack, the BL connection units are coupled to the top and bottom cell stack layers by cell stack connectors disposed between the ends of the cell stack layers and BL connection units, the cell stack connectors serve as heaters for the top and bottom cell stack layers, wherein, when the memory cell is selected for access by activating the wordline of the memory array which the memory cell is coupled to, the secondary selector of the memory cell selects one bit of the plurality of bits based on signals on the respective bitlines.

21. The method of claim 20 wherein the BL connection units comprise an insulator layer in contact with the cell stack connectors for initializing breakdown of the memory cell.

22. The method of claim 20 wherein the top and bottom cell stack layers are doped with insulating islands or heating islands.

\* \* \* \* \*